United States Patent [19]

Oshino

[11] Patent Number: 5,677,939
[45] Date of Patent: Oct. 14, 1997

[54] ILLUMINATING APPARATUS

[75] Inventor: Tetsuya Oshino, Kamakura, Japan

[73] Assignee: Nikon Corporation, Tokyo, Japan

[21] Appl. No.: 392,526

[22] Filed: Feb. 23, 1995

[30] Foreign Application Priority Data

Feb. 23, 1994 [JP] Japan .................. 6-025565
Feb. 23, 1994 [JP] Japan .................. 6-025568
Feb. 23, 1994 [JP] Japan .................. 6-025569

[51] Int. Cl.$^6$ .................................. H01L 21/30
[52] U.S. Cl. .................. 378/34; 378/84; 359/619
[58] Field of Search .................. 378/34, 84, 85; 359/619, 620; 355/53

[56] References Cited

U.S. PATENT DOCUMENTS 5,274,435  12/1993  Hettrick .................. 378/84 X
5,512,759   4/1996  Sweatt .................... 378/34 X
5,581,605  12/1996  Murakami et al. ......... 378/34

FOREIGN PATENT DOCUMENTS 6-97047  4/1994  Japan .

*Primary Examiner*—David P. Porta
*Attorney, Agent, or Firm*—Shapiro and Shapiro

[57] ABSTRACT

The present invention relates to an illuminating apparatus for illuminating an illuminated object in an arcuate pattern and, more particularly, to an illuminating apparatus suitably applicable to exposure apparatus suitably used in transferring a circuit pattern on a photomask (mask or reticle) through a reflection type imaging apparatus onto a substrate such as a wafer by the mirror projection method, for example of an X-ray optical system. The illuminating apparatus of the present invention can illuminate the illuminated surface in an arcuate pattern with uniform intensity. Exposure apparatus provided with the illuminating apparatus of the present invention can obtain an image with uniform exposure over the entire arcuate surface as the illuminated surface, so that the pattern on the mask located on the illuminated surface can be accurately transferred with high throughput onto the substrate.

16 Claims, 22 Drawing Sheets

FIG. 9A
RELATED ART
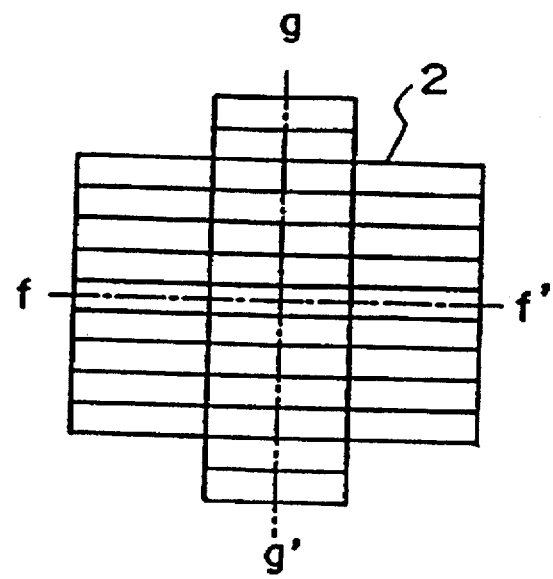
FIG. 9B1
RELATED ART
FIG. 9B2
RELATED ART
FIG. 9C
RELATED ART
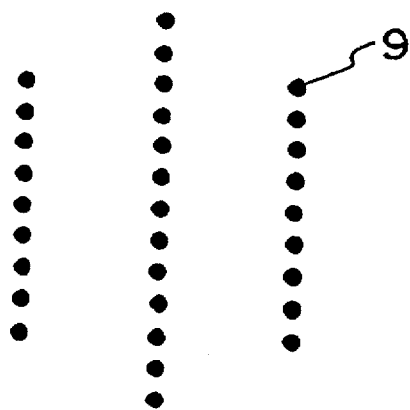

ILLUMINATING APPARATUS

BACKGROUND OF THE INVENTION

1. Field of the Invention

The present invention relates to an illuminating apparatus for illuminating an object to be illuminated in an arcuate pattern, and more particularly, the invention relates to an illuminating apparatus suitably applicable to exposure apparatus for transferring a circuit pattern on a photomask (mask or reticle) through a reflection-type imaging apparatus onto a substrate such as a wafer by the mirror projection method, for example an X-ray optical system.

2. Related Background Art

In exposure in conventional semiconductor fabrication, the circuit pattern formed on a surface of the photomask (hereinafter referred to as a mask) as the object plane is projected to be transferred through the imaging apparatus onto the substrate such as a wafer (hereinafter referred to as a substrate). When exposure light is, for example, X-rays, the imaging apparatus is composed of reflecting mirrors and only an arcuate best image region off the axis of an imaging optical system is utilized, thereby projection-transferring only an arcuate region on the mask onto the wafer. Further, the entire circuit pattern on the mask is transferred onto the wafer while moving the mask and wafer in a certain fixed direction.

This scan type exposure has advantages of relatively high throughput and high resolution.

For exposure of this type, there have been demands to develop an illumination optical system that can illuminate the entire arcuate region on the mask in a uniform manner and with a constant numerical aperture (NA), and the applicant of this application proposed the illumination optical system that could uniformly illuminate the mask in an arcuate pattern, in Japanese Patent Application No. 4-242486 (Japanese Patent Application Laid-Open No. 6-97047).

FIG. 5 and FIG. 6 show the optical system as described in the Japanese Patent Application No. 4-242486. In the drawings, PA represents a parabola, the origin is located at the vertex O of the parabola PA, the Y axis is taken along the axis of symmetry $Ax_0$ of the parabola passing through the vertex O, and the X axis is taken along an axis being perpendicular to the axis of symmetry $Ax_0$ (hereinafter referred to as the Y axis) and passing through the vertex O.

As shown in FIG. 5, a meridional cross section of a special reflecting mirror 3 is a part of the parabola PA, and this special reflecting mirror 3 consists of a part of a parabolic-toric body of rotation obtained by rotating the parabola about a base axis $Ax_1$ (an axis perpendicular to the symmetry axis Y) passing through a position $Y_0$ that is a predetermined distance along the symmetry axis Y from the vertex O. Namely, as shown in FIG. 6, the special reflecting mirror 3 is an arcuate region that is a part of a belt zone between two latitudes 31, 32, of the parabolic-toric body of rotation.

The function of the special reflecting mirror 3 as to light beams in the meridional direction is described by reference to FIG. 5. Here, the light beams in the meridional direction mean those in the plane including the base axis $Ax_1$ of the special reflecting mirror 3 (i.e., in the meridional plane), while light beams in the sagittal direction mean those in a plane (the sagittal plane) perpendicular to the meridional plane.

Supposing an unrepresented optical system forms a light source image (or light source) 1 of a predetermined size at a predetermined position on the base axis $Ax_1$, beams from an arbitrary point on the light source image (or light source) 1 are converted into parallel beams by a converging or condensing function of the special reflecting mirror 3.

For example, beams from the center a of the light source image (or light source) 1 are converted into parallel beams by the special reflecting mirror 3 to illuminate a region $BA_0$ of an illuminated surface normally thereto, but beams from a lower point b of the light source image (or light source) 1 are converted into parallel beams by the special reflecting mirror 3 to obliquely illuminate the region $BA_0$ of the illuminated surface from the upper right. Further, beams from an upper point c on the light source image (or the light source) 1 are converted into parallel beams by the special reflecting mirror 3 to obliquely illuminate the region $BA_0$ of the illuminated surface from the upper left.

As described, the beams from the respective points on the light source image (or light source) 1 are converted into the parallel beams by the special reflecting mirror 3 to uniformly illuminate the region $BA_0$ of the illuminated surface in a superimposed manner.

Checking the numerical aperture in the meridional direction by the special reflecting mirror 3 in this case, the parallel beams from the light source image (or light source) 1 parallel to the optical axis $AX_{20}$ (the beams represented by the solid lines) are converged by the special reflecting mirror 3 at the center on the region $BA_0$ of the illuminated surface under a numerical aperture $NA_M$ $(=\sin\theta_M)$, and the parallel beams from the light source image (or light source) 1 having a divergent angle $\epsilon_1$ relative to the optical axis $AX_{20}$ (the beams represented by the dashed lines) are converged by the special reflecting mirror 3 at the left edge on the region $BA_0$ of the illuminated surface under the numerical aperture $NA_M$. Further, the parallel beams from the light source image (or light source) 1 having a divergent angle $\epsilon_2$ $(=\epsilon_1)$, which is symmetric in direction with the divergent angle $\epsilon_1$ but equal in angle to the divergent angle $\epsilon_1$, are converged by the special reflecting mirror 3 at the right edge on the region $BA_0$ of the illuminated surface under the numerical aperture $NA_M$. The optical axis $AX_{20}$ is bent 90 degrees by the special reflecting mirror 3.

It is thus understood that parallel beams having an arbitrary divergent angle from the light source image (or light source) 1 are converged under the constant numerical aperture $NA_M$ at any position in the meridional direction on the region $BA_0$ of the illuminated surface and that the principal rays ($p_a$, $p_b$, $p_c$) of the parallel beams from the light source image (or light source) 1 are always parallel to the optical axis $AX_{20}$ while maintaining the telecentricity.

The function of the special reflecting mirror 3 in the sagittal direction is next described referring to FIG. 6. Parallel beams 21 from the light source image (or light source) 1 formed on the base axis $Ax_1$ are converged by the special reflecting mirror 3 on the region $BA_0$ of the illuminated surface, and parallel beams 22 from the light source image (or light source) 1, outgoing at a divergent angle $\phi$ from the parallel beams 21, are converged by the special reflecting mirror 3 on a region $BA_1$ of the illuminated surface.

Here, let us check beams in the sagittal direction out of the beams from the light source image (or light source) 1 forming the region $BA_1$ of the illuminated surface. Similarly to the case of FIG. 5, parallel beams having an arbitrary divergent angle from the light source image (or light source) 1 are converged under the constant numerical aperture $NA_M$ at any position in the meridional direction on the region $BA_1$ of the illuminated surface and the principal rays of the parallel beams from the light source image (or light source) 1 are always parallel to the optical axis $Ax_{21}$ while maintaining the telecentricity.

Therefore, when the parallel beams from the light source image (or light source) 1 formed on the base axis $Ax_1$ are outgoing radially in directions toward the arc of the special reflecting mirror 3 (or in directions towards the latitudes 31, 32 of the parabolic-toric body of rotation), an arcuate illumination region BF is formed in a state where the telecentricity is maintained.

The arcuate illumination region BF corresponds to the illuminated surface, and the light source image or light source is located at infinity with respect to the illuminated surface. Here, a projection optical system telecentric on the entrance side is provided below the illuminated surface, and a light source image is formed at the position of the entrance pupil of the projection optical system. It is thus understood that the illuminated surface is illuminated under the so-called Köhler illumination.

In the above illuminating apparatus, the light source image (or light source) 1 formed on the base axis $Ax_1$ is produced, for example, by an optical integrator. In order to construct an optical system in the short wavelength region including X-rays etc., all elements in the optical system must be reflection type members. Therefore, the optical integrator used in the short wavelength region must be of a reflection type.

An example of the reflection type optical integrator is a fly's eye mirror in which a plurality of curved surface mirrors are arranged in a two-dimensional array, as shown in FIG. 8A. The plurality of curved surface mirrors are concave surface mirrors, for example as shown in the cross section of FIG. 8B (which is a cross section along e-e' of FIG. 8A). Such a fly's eye mirror forms the light source image (or light source) in which fine light sources 9 are arranged in a two-dimensional array (FIG. 8C).

Here is described a case where the above illumination optical system (as disclosed in Japanese Patent Application No. 4-242486) is applied to a soft X-ray exposure apparatus, by reference to FIGS. 7A and 7B. FIG. 7A shows a cross section in the meridional direction, of the illumination optical system. Although the drawings show a transmission type optical system in order to facilitate the description, the optical system is of a reflection type in fact.

X-rays diverging from an X-ray source (an example of the light source in a light source system) 4 are converted into parallel beams by the reflecting mirror 5 and the reflection type optical integrator 2 forms the light source image (or light source) composed of the plurality of fine light sources 9. Further, X-rays diverging from the light source image (or light source) are converted into parallel beams by the special reflecting mirror 3 to illuminate the illuminated surface BF.

In this case, a divergent angle $\theta_{i1}$ of the X-rays diverging from the light source image (or light source) is determined by a width $L_1$ of the illuminated region and a distance between the light source image (or light source) and the special reflecting mirror 3. For example, supposing $L_1$ is 2 mm and the distance is 120 mm, the divergent angle $\theta_{i1}$ is about 1°.

Next described using FIG. 7B is a cross section in the sagittal direction, of the illumination optical system. X-rays diverging from the X-ray source 4 are converted into parallel beams by the reflecting mirror 5, and the reflection type optical integrator 2 forms the light source image (or light source) composed of the plurality of fine light sources 9. Further, X-rays diverging from the light source image (or light source) are converted into parallel beams by the special reflecting mirror 3 to illuminate the illuminated surface BF.

In this case, a divergent angle $\theta_{i2}$ of the X-rays diverging from the light source image (or light source) is determined by a width $L_2$ of the illuminated region and a distance between the light source image (or light source) and the special reflecting mirror 3. For example, supposing $L_2$ is 2 mm and the distance is 120 mm, the divergent angle $\theta_{i2}$ is about 60°.

Therefore, in such a case, the reflection type optical integrator needs to be constructed to have largely different divergent angles in the sagittal direction and in the meridional direction.

An example of the reflection type optical integrator having such largely different divergent angles is a fly's eye mirror as shown in FIG. 9A. A plurality of curved surface mirrors constituting the fly's eye mirror each are, for example, a rectangular part cut out from a spherical mirror. Cross sections thereof are those as shown in FIG. 9B1 and FIG. 9B2. Here, FIG. 9B1 is a cross section along f-f' in FIG. 9A, and FIG. 9B2 a cross section along g-g' in FIG. 9A.

The light source image (or light source) formed by such a fly's eye mirror, however, includes different numbers of fine light sources 9 in the meridional direction and in the sagittal direction, as shown in FIG. 9C. Such a difference in the number of fine light sources 9 depending upon the direction will generally cause directional variations of resolution of exposure apparatus, which is thus not preferable.

It is conceivable in this case that the directional variations can be decreased by increasing the number of fine light sources, but the size of the curved surface mirrors constituting the fly's eye mirror must be decreased in order to increase the number of secondary light sources, which makes them hard to produce.

If the reflection type optical integrator is composed of a plurality of fly's eye mirrors, the number of fine light sources in the meridional direction can be made equal to that in the sagittal direction. However, because the reflectivity of a reflecting mirror is low in the soft X-ray region, there occurs a problem that the overall X-ray reflectivity of the whole illumination optical system is considerably lowered where the plurality of fly's eye mirrors are used as the reflection type optical integrator. The throughput of the exposure apparatus also decreases thereby.

As described above, there are problems with use of the fly's eye mirror.

Then, in order to largely differentiate the divergent angle in the sagittal direction from that in the meridional direction, the reflection type optical integrator can be constructed in such an arrangement that two or more reflecting mirrors, in each of which a plurality of cylindrical mirrors are integrally aligned, for example as shown in FIG. 14, are set perpendicular to each other as shown in FIG. 15, whereby the divergent angle in the sagittal direction can be made largely different from that in the meridional direction.

Namely, when the integrator 4a and integrator 4b converge X-rays in the meridional direction and in the sagittal direction, respectively, and when their focus positions are arranged to fall on the light source image (or light source), the light source image (or light source) 1 is formed with different divergent angles between in the meridional direction and in the sagittal direction.

Incidentally, as shown in FIG. 16 and FIG. 23, checking parallel beams in the sagittal direction (in directions on the plane of the drawing) as to X-rays 2 outgoing (output) from the light source image (or light source) 1 formed by the optical integrator, and defining the diameter of parallel beams at an exit angle of 0°, 21 (in the case of FIG. 16) or 24 (in the case of FIG. 23), as P(0)=q, a diameter of parallel beams 23 at an exit angle of θ is given as P(θ)=q·cosθ. Thus, the beam diameter P(θ) in a direction on the plane of the drawing becomes smaller as the exit angle θ increases.

Thus, the cross section of parallel beams 21, 24 at the exit angle of 0° becomes nearly circular as shown in FIG. 17A or FIG. 24A, whereas the cross section of parallel beams 23, 26 at the exit angle of θ becomes elliptic with the major axis of P(0) in the meridional direction and the minor axis of P(θ) in the sagittal direction, as shown in FIG. 17B or FIG. 24B.

As a result, a converging state of the converging beams after the parallel beams 21, 24 at the exit angle of 0° are subjected to the converging function by the special reflecting mirror 3 is such that the beams are converged in a circular cone spanning an always equal angle θ at converging point $p_1$ in the arcuate illumination region BF formed on the illuminated surface; whereas, a converging state of the converging beams after the parallel beams 23, 26 at the exit angle of θ are subjected to the converging function by the special reflecting mirror 3 is such that the beams are converged in an elliptic cone to form a converging point $p_2$ in the arcuate illumination region BF on the illuminated surface (FIG. 18 or FIG. 25).

This results in a problem that the angle spanned by the converging beams at the converging point $p_2$ in the radial direction R at the converging point $p_2$ is equal to that of the converging beams of the above parallel beams 21, 24 whereas the angle spanned by the converging beams at the converging point $p_2$ in the tangent direction T at the converging point $p_2$ is smaller (cosθ times smaller) than that in the radial direction R at the converging point $p_2$. This problem becomes especially significant for parallel beams outgoing at a greater exit angle θ in the sagittal direction.

When an illuminated object is illuminated by such an illuminating apparatus to converge the parallel beams in different cross sections and when an image thereof is formed by an imaging apparatus, the resolution thereof generally becomes nonuniform in the image plane. This is caused because part of the illuminated object is illuminated under such a condition that it does not satisfy the numerical aperture required by the imaging optical system.

In more detail, if a numerical aperture of illumination light in the portion which is illuminated by the parallel beams at the exit angle of 0° in the arcuate illumination region is set to be approximately equal to that of the imaging apparatus, a numerical aperture of illumination light in a portion illuminated by parallel beams at large exit angles in the arcuate illumination region becomes smaller than the numerical aperture of the imaging apparatus. This results in a problem that an image can be obtained only at a lower resolution in this portion.

In order to avoid such a problem, the numerical aperture of illumination light in the portion illuminated by the parallel beams at largest exit angles in the arcuate illumination region may be set to be approximately equal to the numerical aperture of the imaging apparatus. In this case, the portion illuminated by the parallel beams at relatively small exit angles is illuminated under a larger numerical aperture than the numerical aperture of the imaging apparatus, but excessive illumination light can be removed by a slit or the like provided in the imaging apparatus. An image with a uniform resolution can be attained accordingly by illuminating the illuminated object by such an illuminating apparatus.

Incidentally, when the illuminated object is illuminated by the above illuminating apparatus, the diameter of beams 23 contributing to image formation out of the parallel beams 26 of the exit angle θ (beam diameter p(θ)) becomes $p_1(θ)$ (equal to p(φ)) as shown in FIG. 26, which is smaller than the beam diameter p(θ) of the parallel beams 26. This means that X-rays outside the beam diameter $p_1(θ)$ are eliminated by the imaging apparatus.

If the optical integrator has a uniform reflectivity, the X-ray intensity of each parallel beams of the beams diameter $p_1(θ)$, which are beams of substantial illumination light, differs depending upon θ, because the X-ray intensity of the parallel beams of the beam diameter p(θ) is constant. Namely, the illuminated surface is not illuminated in a substantially uniform intensity, thus causing illumination variations.

As described above, the arrangement using two or more reflecting mirrors in each of which a plurality of cylindrical mirrors are aligned also has problems.

SUMMARY OF THE INVENTION

It is, therefore, a first object of the present invention to provide an illuminating apparatus which can be produced more easily than heretofore and which does not greatly lower the X-ray reflectivity, solving the problems caused in the use of the fly's eye mirror.

It is a second object of the present invention to provide a high-performance illuminating apparatus which has a much higher illumination efficiency than heretofore and which can make the numerical aperture in the illumination region formed in an arcuate shape approximately uniform irrespective of an illumination position, solving the problems caused in the use of two or more reflecting mirrors in each of which a plurality of cylindrical mirrors as described above are aligned, and to provide an exposure apparatus provided with the illuminating apparatus.

To achieve the objects, a first aspect of the present invention is an illuminating apparatus comprising, at least, a light source system for forming a light source image of a predetermined size, and a condensing optical system for condensing beams from the light source system to illuminate an illuminated object.

The light source system has a light source portion for supplying parallel beams, and a reflection type optical integrator for forming a plurality of light source images from the parallel beams from the light source portion;

the reflection type optical integrator is provided with a reflecting surface for effecting the critical illumination in the meridional direction of the condensing optical system and a reflecting surface for effecting the Köhler illumination in the sagittal direction thereof;

the condensing optical system has a special reflecting mirror for converting the beams from the light source image into parallel beams to illuminate the illuminated object in an arcuate pattern; and the special reflecting mirror is constructed of a part of a parabolic-toric body of rotation obtained by rotating a parabola about a base axis normal to a symmetric axis of the parabola and passing through a position that is a predetermined distance along the symmetry axis of the parabola from the vertex of the parabola.

Further, a second aspect of the present invention is an illuminating apparatus comprising, at least, light source system for forming a light source image of a predetermined size, and a condensing optical system for condensing beams from the light source system to illuminate an illuminated object.

The light source system has a light source portion for supplying parallel beams, and a reflection type optical integrator for forming a plurality of light source images from the parallel beams from the light source portion;

the reflection type optical integrator is so arranged that a plurality of cylindrical reflecting surfaces are continuously and integrally formed only in one direction, so that there are formed reflecting surfaces for effecting the critical illumination in the meridional direction of the condensing optical system and reflecting surfaces for effecting the Köhler illumination in the sagittal direction thereof;

the condensing optical system has a special reflecting mirror for converting the beams from the light source image into parallel beams to illuminate the illuminated object in an arcuate pattern; and the special reflecting mirror is constructed of a part of a parabolic-toric body of rotation obtained by rotating a parabola about a base axis normal to a symmetric axis of the parabola and passing through a position that is a predetermined distance along the symmetry axis of the parabola from the vertex of the parabola.

Further, a third aspect of the present invention is an illuminating apparatus arranged in such a manner that in the illuminating apparatus of the second aspect of the invention, an X-ray reflecting multilayer film is provided on the reflecting surfaces of the reflection type optical integrator and the special reflecting mirror.

Further, a fourth aspect of the present invention is an illuminating apparatus arranged in such a manner that in the illuminating apparatus of the third aspect of the invention, the X-ray reflecting multilayer film is formed from a lamination of a plurality of alternate layers of either one combination selected from combinations of molybdenum/silicon, molybdenum/silicon compound, ruthenium/silicon, ruthenium/silicon compound, rhodium/silicon, and rhodium/silicon compound.

Further, a fifth aspect of the present invention is an illuminating apparatus comprising, at least, a light source system for forming a light source image of a predetermined size, and a condensing optical system for condensing beams from the light source system to illuminate an illuminated object.

The light source system has a light source portion for supplying parallel beams, and an optical integrator provided with a reflecting region and a non-reflecting region, for forming a plurality of light source images from the parallel beams from the light source portion;

the condensing optical system has a special reflecting mirror for converting the beams from the light source image into parallel beams to illuminate the illuminated object in an arcuate pattern; and the special reflecting mirror is constructed of a part of a parabolic-toric body of rotation obtained by rotating a parabola about a base axis normal to a symmetric axis of the parabola and passing through a position that is a predetermined distance along the symmetry axis of the parabola from the vertex of the parabola.

Further, a sixth aspect of the present invention is an illuminating apparatus arranged in such a manner that in the illuminating apparatus of the fifth aspect of invention, the reflecting region of the optical integrator is formed from an X-ray reflecting multilayer film.

Further, a seventh aspect of the present invention is an illuminating apparatus arranged in such a manner that in the illuminating apparatus of the sixth aspect of the invention, the X-ray reflecting multilayer film is formed from a lamination of a plurality of alternate layers of either one combination selected from combinations of molybdenum/silicon, molybdenum/silicon compound, ruthenium/silicon, ruthenium/silicon compound, rhodium/silicon, and rhodium/silicon compound.

Further, an eighth aspect of the present invention is an illuminating apparatus arranged in such a manner that in the illuminating apparatus of the sixth aspect of the invention, the non-reflecting region of the optical integrator is formed from an X-ray absorbing film.

Further, a ninth aspect of the present invention is an illuminating apparatus arranged in such a manner that in the illuminating apparatus of the eighth aspect of the invention, the X-ray absorbing film is made of nickel, silver, cadmium, cobalt, copper, iron, indium, nickel, platinum, antimony, tin, tellurium, or zinc, or a substance containing either one as a main ingredient.

Further, a tenth aspect of the present invention is an illuminating apparatus comprising, at least, a light source system for forming a light source image of a predetermined size, and a condensing optical system for condensing beams from the light source system to illuminate an illuminated object.

The light source system has a light source portion for supplying parallel beams, and a reflection type optical integrator for forming a plurality of light source images from the parallel beams from the light source portion;

the condensing optical system has a special reflecting mirror for converting the beams from the light source image into parallel beams to illuminate the illuminated object in an arcuate pattern;

the special reflecting mirror is constructed of a part of a parabolic-toric body of rotation obtained by rotating a parabola about a base axis normal to a symmetric axis of the parabola and passing through a position a predetermined distance that is along the symmetry axis of the parabola from the vertex of the parabola; and a desired X-ray reflectivity distribution is provided in a reflecting surface of the optical integrator and/or the special reflecting mirror.

Further, an eleventh aspect of the present invention is an illuminating apparatus arranged in such a manner that in the illuminating apparatus of the tenth aspect of the invention, the desired X-ray reflectivity distribution is provided so as to make a value of $R_1(\theta) \cdot R_2(\theta)/\cos\theta$ constant or nearly constant, where $\theta$ is an exit angle of X-rays outgoing from a reflecting surface of the optical integrator, $R_1(\theta)$ a reflectivity on the reflecting mirror in that case, and $R_2(\theta)$ a reflectivity when the X-rays outgoing at the exit angle $\theta$ from the reflecting surface are reflected by the special reflecting mirror.

Further, a twelfth aspect of the present invention is an illuminating apparatus arranged in such a manner that in the illuminating apparatus of eleventh aspect of the invention, the desired X-ray reflectivity distribution is provided by forming an X-ray reflecting multilayer film having an in-plane distribution of period lengths, on the reflecting surface of the optical integrator and/or the special reflecting mirror.

Further, a thirteenth aspect of the present invention is an illuminating apparatus arranged in such a manner that in the illuminating apparatus of eleventh aspect of the invention, the desired X-ray reflectivity distribution is provided by forming an X-ray reflecting multilayer film having an in-plane distribution of period numbers, on the reflecting surface of the optical integrator and/or the special reflecting mirror.

Further, a fourteenth aspect of the present invention is an illuminating apparatus arranged in such a manner that in the illuminating apparatus of the eleventh aspect of the invention, the desired X-ray reflectivity distribution is provided by forming an X-ray reflecting multilayer film and an X-ray absorbing film thereon having a film thickness distribution, on the reflecting surface of the optical integrator and/or the special reflecting mirror.

Further, a fifteenth aspect of the present invention is an illuminating apparatus arranged in such a manner that in the illuminating apparatus of the fourteenth aspect of the invention, the X-ray reflecting multilayer film is formed from a lamination of a plurality of alternate layers of one combination selected from combinations of molybdenum/silicon, molybdenum/silicon compound, ruthenium/silicon, ruthenium/silicon compound, rhodium/silicon, and rhodium/silicon compound.

Further, a sixteenth aspect of the present invention is an illuminating apparatus arranged in such a manner that in the illuminating apparatus of the fourteenth aspect of the invention, the X-ray absorbing film is made of silicon, beryllium, zirconium, boron, carbon, or molybdenum, or a substance containing one as a main ingredient.

FIG. 1 shows an optical system of illuminating apparatus (an example) according to the present invention (first to fourth aspects) and is a cross section in the meridional direction, of the light source portion 1', reflection type optical integrator 2, light source image (or light source) 1, and special reflecting mirror (condensing optical system) 3.

As shown in FIG. 5, the cross section in the meridional direction, of the special reflecting mirror 3 forms a part of parabola PA and the special reflecting mirror 3 is constructed of a part of a parabolic-toric body of rotation obtained by rotating the parabola about the base axis $Ax_1$ (the axis perpendicular to the symmetry axis Y) passing a position $Y_0$ apart a predetermined distance along the symmetry axis Y from the vertex O. Namely, as shown in FIG. 6, the special reflecting mirror 3 is formed in an arcuate shape constructed of a part of a belt region between two latitudes 31, 32 of the parabolic-toric body of rotation.

The light source portion 1' supplies parallel beams or nearly parallel beams, which are incident to the reflection type optical integrator 2. The reflection type optical integrator 2 is provided with reflecting surfaces for effecting the critical illumination in the meridional direction and reflecting surfaces for effecting the Köhler illumination in the sagittal direction.

This reflection type optical integrator 2 is so arranged, as shown in FIG. 3A and FIG. 3B (the cross section-along d–d' in FIG. 3A), that, for example, cylindrical reflecting surfaces (an example of curved surface mirrors) are continuously and integrally formed only in one direction. Namely, the reflection type optical integrator 2 according to the present invention is simpler in structure than the conventional reflection type optical integrator using the fly's eye mirror. Further, the reflecting surfaces do not have to be made so small as in the fly's eye mirror in order to overcome the directional variations of resolution in the exposure apparatus. Therefore, the reflection type optical integrator 2 according to the present invention (the first to fourth aspects) is easy to produce.

In addition, because the reflection type optical integrator 2 according to the present invention (the first to fourth aspects) includes a plurality of reflecting surfaces integrally formed, it has no such problem that the overall X-ray reflectivity of the entire illumination optical system is greatly lowered as in the case of using a plurality of fly's eye mirrors as the reflection type optical integrator.

The reflection type optical integrator 2 converges or condenses the parallel beams incident thereto in linear patterns in the sagittal direction on the base axis $Ax_1$. Therefore, the light source image (or light source) 1 consisting of an assemblage of linear light sources 9 is formed in the number corresponding to the number of the cylindrical reflecting surfaces (an example of curved surface mirrors) in the converged place (FIG. 3C).

The beams from the light source image (or light source) 1 thus formed are reflected and converged by the special reflecting mirror 3, whereby the illuminated surface is illuminated in an arcuate pattern.

The optical system of the illuminating apparatus according to the present invention (the first to fourth aspects) is described by reference to FIGS. 2A and 2B. Although FIGS. 2A and 2B show a transmission type optical system in order to facilitate the description, the optical system is of the reflection type in fact.

FIG. 2A shows a cross section in the meridional direction, of the optical system of the illuminating apparatus. X-rays diverging from the X-ray source 4 are converted into parallel beams by the reflecting mirror 5 etc. to enter the reflection type optical integrator (not shown). Here, because the reflection type optical integrator has no converging effect on the beams in the meridional direction, the parallel beams are output in parallel in the meridional direction from the reflection type optical integrator.

The X-rays output in the meridional direction from the reflection type optical integrator are converged by the special reflecting mirror 3 to illuminate the illuminated surface BF. In this case, the parallel beams incident to the special reflecting mirror 3 are converged at a point on the illuminated surface BF.

Namely, the X-rays diverging from a point on the X-ray source 4 are converged through the optical system at a point on the illuminated surface BF in the meridional direction (cross section). Therefore, the illuminated surface is illuminated under the critical illumination in the meridional direction (in the direction of the radius of the arc of the arcuate illuminated surface BF; in the direction parallel to the $Ax_0$ axis) so as to satisfy the uniformity of the numerical aperture.

The uniformity of intensity in the meridional direction will be disturbed if a spatial intensity distribution of the X-ray source 4 is not uniform. Nevertheless, because the mask and wafer are moved in one direction in the exposure apparatus, the non uniformity of intensity distribution will be overcome in the moving direction. In other words, the non uniformity of intensity distribution in the meridional direction can be overcome by making the moving direction coincident with the meridional direction. Therefore, fully satisfactory illumination is made by the critical illumination in the meridional direction of the illuminated surface BF.

A width (meridional width) $L_1$ of the illumination light on the illuminated surface BF is determined by a size $L_3$ of the X-ray source 4 and a magnification in the meridional direction, of the illumination optical system (FIG. 2A). In the case of a synchrotron radiation (SR) or laser plasma X-ray source (LPX), which are typical soft X-ray sources, the size of the radiation source is about 1 mm or less. Therefore, insofar as the magnification of the illumination optical system is not increased too much, the width $L_1$ can be kept fully small and a spatial, optical loss can also be kept fully small.

Next described referring to FIG. 2B is a state in the sagittal direction of the optical system of the illuminating apparatus according to the present invention (the first to fourth aspects). FIG. 2B shows a cross section in the sagittal direction, of the optical system of the illuminating apparatus.

The X-rays diverging from the X-ray source 4 are converted into parallel beams by the reflecting mirror 5 to be incident on the reflection type optical integrator 2. Since the reflection type optical integrator 2 has the converging effect on the beams in the sagittal direction, it forms the light source image (or light source) composed of a plurality of fine light sources (linear light sources) 9 in the sagittal direction. This light source image (or light source) is an array of linear, fine light sources 9 arranged in the sagittal direction, as shown in FIG. 3C.

X-rays diverging in the sagittal direction from the light source image (or light source) consisting of the plurality of fine light sources (linear light sources) 9 are converted into parallel beams by the special reflecting mirror 3 to illuminate the illuminated surface BF. Namely, the illuminated surface BF is illuminated under the Köhler illumination in the sagittal direction so that the both uniformities of the numerical aperture and the illumination intensity are satisfied simultaneously.

The reflecting surfaces constituting the reflection type optical integrator according to the present invention (the first to fourth aspects) may be either concave surfaces or convex surfaces. When the reflecting surfaces are concave surfaces, the light source image (or light source) 1 is formed on the output side of the reflecting surfaces. Therefore, the light source image (or light source) 1 can be formed on the base axis $Ax_1$ by placing the reflection type optical integrator 2 on the left side of the base axis $Ax_1$ on the plane of FIG. 1. When the reflecting surfaces are convex surfaces, the light source image (or light source) 1 is formed on the opposite side to the output side of the reflective surfaces. Therefore, the light source image (or light source) 1 can be formed on the base axis $Ax_1$ by placing the reflection type optical integrator 2 on the right side of the base axis $Ax_1$ on the plane of FIG. 1.

It is preferred that the reflective surfaces of the reflection type optical integrator and the special reflecting mirror according to the present invention (the first to third aspects) be formed from an X-ray reflecting multilayer film (the fourth aspect). The X-ray reflecting multilayer film is preferably formed from a lamination of a plurality of alternate layers of one combination selected from combinations of molybdenum/silicon, molybdenum/silicon compound, ruthenium/silicon, ruthenium/silicon compound, rhodium/silicon, and rhodium/silicon compound (this arrangement is particularly preferable in the case of X-rays with a wavelength of about 13 nm).

As described above, the reflection type optical integrator according to the present invention (the first to fourth aspects) is easier to produce than the conventional integrators and free of a great decrease in X-ray reflectivity.

With the illuminating apparatus provided with such a reflection type optical integrator, the illuminated surface is illuminated under the critical illumination in the meridional direction while satisfying the uniformity of numerical aperture. Further, the illuminated surface is illuminated under the Köhler illumination in the sagittal direction while simultaneously satisfying the uniformities of numerical aperture and illumination intensity.

Namely, the illuminated surface can be illuminated in an arcuate pattern with uniform intensity by the illuminating apparatus (the first to fourth aspects) of the present invention. Thus, the exposure apparatus provided with the illuminating apparatus of the present invention (the first to fourth aspects) can obtain an image with uniform exposure over the entire arcuate surface as the illuminated surface, so that a pattern on the mask located on the illuminated surface can be accurately transferred with high throughput onto the substrate.

As shown in FIG. 5, the cross section in the meridional direction, of the special reflecting mirror 3 according to the present invention (the fifth to ninth aspects) is a part of parabola PA, and this special reflecting mirror 3 consists of a part of a parabolic-toric body of rotation obtained by rotating the parabola about the base axis $Ax_1$ (an axis perpendicular to the symmetry axis Y) passing a position $Y_0$ apart a predetermined distance along the symmetry axis Y from the vertex O. Namely, as shown in FIG. 6, the special reflecting mirror 3 has an arcuate shape composed of a part of a belt region between two latitudes 31, 32 of the parabolic-toric body of rotation.

FIG. 10 shows an example of the illuminating apparatus according to the present invention (the fifth to ninth aspects) and is a partial cross section in the sagittal direction, of the light source image (or light source) 1 and the special reflecting mirror (an example of the condensing optical system) 3. Here, parallel beams 21, 22, 23 outgoing (output) from the light source image (or light source) 1 are arranged so that beam diameters thereof all become equal to (or approximately equal to) each other. In detail, when output from a portion of the light source image (or light source) where the sagittal width is q(0), in the light source image (or light source) 1, the parallel beams 21 at the exit angle of 0° form a bundle of beams of a width p(0).

Also, when output from a portion of the light source image (or light source) where the sagittal width is q($\phi$), in the light source image (or light source) 1, the parallel beams 23 outgoing at an angle $\phi$ form a bundle of beams of a width p($\phi$).

Further, when output from a portion of the light source image (or light source) where the sagittal width is q($\theta$), in the light source image (or light source) 1, the parallel beams 22 outgoing at an angle $\theta$ form a bundle of beams of a width p($\theta$).

Then the sagittal widths q(0), q($\theta$), q($\phi$) of the portions of the light source image (or light source) are determined so that the widths of the parallel beams p(0), p($\theta$), p($\phi$) become equal (or approximately equal) to each other.

The following describes the light source image (or light source) 1 satisfying the above condition. First, point light sources located between the center 0 of the light source image (or light source) 1 and a point $S_2$ located at a distance of q(0)/2 in the sagittal direction from the center 0 emit light (for example, X-rays etc.) with a diverging angle 2$\phi$. Point light sources outside it, i.e., between the point $S_2$ and a point $S_1$ at a distance of q($\phi$)/2 in the sagittal direction from the center 0 of the light source image (or light source), emit light (for example, X-rays etc.) with an angle between the exit angle $\theta$ and the exit angle $\phi$, where $\theta$ is an arbitrary angle satisfying 0<$\theta$<$\phi$.

The illuminating apparatus according to the present invention (the fifth to ninth aspects) is further described in more detail using the partial cross section of the optical integrator (an example of the optical integrator according to the present aspects) of FIG. 11. FIG. 11 shows a partial cross section in the sagittal plane, of the optical integrator 4.

FIG. 11 shows only a half of the optical integrator 4, assuming the optical integrator 4 is symmetric with respect to the symmetry axis $A_0$. Further, FIG. 11 shows only some of a plurality of curved surface reflecting mirrors (hereinafter referred to as curved surface mirrors) constituting the optical integrator 4 in order to facilitate the description. Namely, actual applications often include a lot of curved surface mirrors adjacent to each other.

When the curved surface mirrors are convex surfaces as shown in FIG. 11, the light source image (or light source, not shown) is formed on the left side of the reflecting surfaces on the plane of the drawing. Conversely, if they are concave surfaces, the light source image (or light source, not shown) is formed on the right side of the reflecting surfaces on the plane of the drawing.

A curved surface mirror 41 is located on the symmetry axis $A_0$ of the optical integrator 4 and light (for example, X-rays etc.) incident to the curved surface mirror is outgoing as divergent light with divergent angle $2\phi$. Similarly, in the case of a curved surface mirror 42 located at $q(0)/2$ from the symmetry axis $A_0$, incident light (for example, X-rays etc.) is outgoing as divergent light with divergent angle $2\phi$, as in the case of the curved surface mirror 41. On the other hand, in the case of a curved surface mirror 44 located at $q(\phi)/2$ from the symmetry axis $A_0$, light (for example, X-rays etc.) is reflected only at an exit angle $\phi$, but is not reflected at other angles. Further, a curved surface mirror 43 between the curved surface mirror 42 and the curved surface mirror 44 reflects the light (for example, X-rays etc.) at angles only between the exit angles $\theta$ and $\phi$.

The curved surface mirror 43 is further described in more detail using FIG. 12. FIG. 12 is a cross section in the sagittal plane, of the curved surface mirror 43. On the surface of the curved surface mirror 43 there are a reflecting region (reflecting portion) 5 for reflecting the light (for example, X-rays etc.) and a non-reflecting region (non-reflecting portion) 6 that does not reflect the light.

For example, in the case where the light is X-rays, the non-reflecting region 6 may be provided in such a manner that the multilayer film is not formed there on the surface of the curved surface mirror so as not to reflect the X-rays (or that the multilayer film is removed), or in such a manner that an absorbing member 7 made of a substance that is liable to absorb the X-rays is formed on the surface of the multilayer film, as shown in FIG. 12.

The angle $\theta$ is determined by the magnitude of width m of the absorbing member 7, and there is a relation of formula (1) between $\theta$ and m, when a radius of curvature of a reflecting surface of a curved surface mirror is r.

$$m = 2r \sin(\theta/2) \quad (1)$$

Namely, adjusting the width m of the absorbing member 7, $\theta$ can be set at an arbitrary value between 0 and $\phi$.

In order to keep $P(\theta)$ in FIG. 10 always constant in the range of $0 < \theta < \phi$, the relation of formula (2) should hold.

$$q(0) = q(\phi) \cdot \cos\phi = q(\theta) \cdot \cos\theta \quad (2)$$

From this formula (2), the following formula (3) is obtained.

$$\cos\theta = q(0)/q(\theta) = q(0)/\{q(0) + 2x\} \quad (3)$$

In the formula, x represents a distance x shown in FIG. 11.

Therefore, in the curved surface mirror 43 shown in FIG. 11, $P(\theta)$ becomes always constant when $\theta$ satisfies the relation of formula (4) with respect to the distance x, and its value is $q(0)$.

$$\theta = \cos^{-1}[q(0)/\{q(0) + 2x\}] \quad (4)$$

Further, to obtain such $\theta$, the width m of the absorbing member 7 should be set at the value given by formula (1).

Using such an optical integrator, parallel beams having the same cross section are emitted at respective exit angles from the light source image (or light source). Accordingly, the illuminating apparatus according to the present invention can illuminate the illuminated surface with a same numerical aperture at any position without increasing the number of reflecting mirrors (or without lowering a quantity of X-rays) as compared with the conventional illuminating apparatus. Namely, it can illuminate the illuminated surface in the arcuate pattern with a uniform numerical aperture while maintaining the telecentricity under the Köhler illumination.

In order to keep the reflectivity high, the X-ray reflecting multilayer film is preferably formed from a lamination of a plurality of alternate layers of one combination selected from combinations of molybdenum/silicon, molybdenum/silicon compound, ruthenium/silicon, ruthenium/silicon compound, rhodium/silicon, and rhodium/silicon compound (this arrangement is particularly preferable when the X-rays of a wavelength of 13 nm are used).

Further, the X-ray absorbing film is preferably made of a substance with high absorptance to the X-rays used. For example, the X-ray absorbing film is preferably made of nickel (particularly preferable), silver, cadmium, cobalt, copper, iron, indium, nickel, platinum, antimony, tin, tellurium, or zinc, or a substance containing one of them as a main ingredient (this is particularly preferable when the X-rays of a wavelength of 13 nm are used).

The reflecting curved surfaces constituting the optical integrator may be constructed of the fly's eye mirror as well as the cylindrical mirrors.

As described above, the illuminating apparatus of the present invention (the fifth to ninth aspects) can illuminate the illuminated surface in the arcuate pattern with a uniform numerical aperture while maintaining the telecentricity under the Köhler illumination. Therefore, exposure apparatus provided with the illuminating apparatus of the present invention (the fifth to ninth aspects) can obtain an image in a uniform resolution over the entire arcuate surface as the illuminated surface, so that the pattern on the mask located at the illuminated surface can be accurately transferred onto the substrate with high throughput.

FIG. 19 shows an optical system (an example) of the illuminating apparatus according to the present invention (the tenth to sixteenth aspects) and is a perspective view of the light source image (or light source) 1, the condensing optical system consisting of the special reflecting mirror 3, and the arcuate illumination region BF.

As shown in FIG. 5, the cross section in the meridional direction, of the special reflecting mirror 3 is a part of parabola PA and this special reflecting mirror 3 is constructed of a part of a parabolic-toric body of rotation obtained by rotating the parabola about the base axis $Ax_1$ (an axis perpendicular to the symmetry axis Y) passing through the position $Y_0$ that is a predetermined distance along the symmetry axis Y from the vertex O. Namely, as shown in FIG. 6, the special reflecting mirror 3 is formed in an arcuate shape, which is a part of a belt region between two latitudes 31, 32 of the parabolic-toric body of rotation.

Parallel beams 21a, 22a, 23a output (outgoing) from the light source image (or light source) 1 and contributing to image formation are reflected by the special reflecting mirror 3 to become converging beams 21b, 22b, 23b to be converged at points $p_1$, $p_2$, $p_3$ on the arcuate illumination region BF. In this case, the parallel beams 21a, 22a, 23a contributing to image formation are equal in beam diameter to each other, and the converging beams 21b, 22b, 23b contributing to image formation are equal in X-ray intensity to each other.

Namely, in the case of the illuminating apparatus according to the present invention (the tenth to sixteenth aspects), for example, the reflecting surfaces of the optical integrator and/or the special reflecting mirror are provided with a desired X-ray reflectivity distribution so that X-ray intensities of the converging beams 21b, 22b, 23b become equal to each other.

In other words, using the optical integrator and/or special reflecting mirror having the desired X-ray reflectivity distribution, the illuminating apparatus according to the present invention (the tenth to sixteenth aspects), can illuminate the illumination region with a sufficient numerical aperture, independent of an illuminated position, and further with a uniform intensity. Namely, the illuminated surface can be illuminated in the arcuate pattern with a uniform intensity while maintaining the telecentricity under the Köhler illumination.

The desired X-ray reflectivity distribution can be realized, for example, by setting the value of $R_1(\theta) \cdot R_2(\theta)/\cos\theta$ constant or approximately constant.

The X-ray intensities of converging beams 21b, 22b, 23b are determined, for example as shown in FIG. 20 (wherein the optical integrator 4 is enlarged and a part thereof is shown in order to facilitate the description), by the reflectivity $R_1(\theta)$ on a curved surface reflecting mirror 41, of X-rays 2 output at an exit angle $\theta$ from the curved surface reflecting mirror 41 forming the optical integrator 4, and the reflectivity $R_2(\theta)$ when the X-rays 2 output at the exit angle $\theta$ from the curved surface reflecting mirror 41 are reflected by the special reflecting mirror 3.

A basic method for setting the reflectivities $R_1(\theta)$, $R_2(\theta)$ is described in the following. An intensity $I(\theta)$ at each exit angle, of parallel beams 26 emitted from the light source image (or light source) 1 is expressed by formula (1) when an intensity of parallel beams 24 at the exit angle of 0° is $I(0)$.

$$I(\theta)=I(0)\cdot R_1(\theta)/R_1(0) \quad (1)$$

$I(\theta)$ is an intensity of the beams 26, and an intensity $I_1(\theta)$ of substantial beams 23a is given by formula (2).

$$I_1(\theta)=I(\theta)\cdot\cos\phi/\cos\theta \quad (2)$$

On the other hand, an intensity $I_2(\theta)$ of beams 23b incident to the illuminated surface is given by formula (3).

$$I_2(\theta)=I_1(\theta)\cdot R_2(\theta)=I(0)\cdot R_1(\theta)\cdot R_2(\theta)\cos\phi/\{R_1(0)\cdot\cos\theta\} \quad (3)$$

Accordingly, in order to make uniform (or nearly uniform) the intensity $I_2(\theta)$ of beams incident to the illuminated surface, a combination may be selected so that the value of $R_1(\theta) \cdot R_2(\theta)/\cos\theta$ becomes constant (or nearly constant) against the exit angle $\theta$.

If there remains illumination variations in spite of the illumination effected under the above condition (for example, if aberrations of the illumination optical system cause the illumination variations), correction may be well effected based on formula (3) so as to make the illumination intensity $I_2(\theta)$ uniform (or nearly uniform).

As described above, the illuminating apparatus according to the present invention (the tenth to sixteenth aspects) can illuminate the illuminated object in a uniform (or nearly uniform) manner, overcoming the illumination variations (including those due to unknown causes) due to causes other than the substantial change of beam diameter depending upon the exit angle $\theta$.

Further, in cases where restrictions from fabrication of optical elements determine a distribution of either $R_1(\theta)$ or $R_2(\theta)$, the correction is possible by adjusting the other. Namely, the correction is possible by adjusting either one of the optical integrator and the special reflecting mirror.

The desired X-ray reflectivity distribution can be given to the reflecting surface of the optical integrator and/or the special reflecting mirror by providing an X-ray reflecting multilayer film having an in-plane distribution of period lengths in the reflecting surface. In other words, because the X-ray reflectivity changes depending upon the period length of the multilayer film, a desired distribution of reflectivities can be made by forming a distribution of period lengths in a reflecting surface.

The X-ray reflectivity distribution can also be realized by providing an X-ray reflecting multilayer film having an in-plane distribution of period numbers in the reflecting surface. In other words, because the X-ray reflectivity changes depending upon the period number of the multilayer film, a desired distribution of reflectivities can be given by forming a distribution of period numbers in a reflecting surface.

Further, the X-ray reflectivity distribution can also be realized by providing an X-ray reflecting multilayer film and an X-ray absorbing film thereon having a distribution of film thicknesses on a reflecting surface.

In order to keep the reflectivity high the X-ray reflecting multilayer film is preferably formed from a lamination of a plurality of alternate layers of one combination selected from combinations of molybdenum/silicon, molybdenum/silicon compound, ruthenium/silicon, ruthenium/silicon compound, rhodium/silicon, and rhodium/silicon compound (this arrangement is particularly preferable in the cases of use of the X-rays of wavelength 13 nm).

Further, the X-ray absorbing film may be made of any substance that can absorb the X-rays used, and it is preferably made of a substance that can readily control the X-ray transmittance by changing the film thickness. For example, the X-ray absorbing film is preferably made of silicon, beryllium, zirconium, boron, carbon, or molybdenum, each having a relatively low X-ray absorptance, or a substance containing one of them as a main ingredient (this arrangement is particularly preferable in the cases of use of the X-rays of wavelength 13 nm).

When the X-ray absorbing film is made of one of these substances, the film thickness control for obtaining a desired transmittance distribution (eventually, for obtaining a desired reflectivity distribution) becomes easier. Since the X-ray transmittance can also be readily controlled by changing the film thickness of either one of the above materials suitable for the X-ray reflecting multilayer film, the X-ray absorbing film may be made of either one of these materials.

The reflecting curved surfaces constituting the optical integrator may be constructed of the fly's eye mirror in addition to the cylindrical mirrors.

As described above, the illuminating apparatus of the present invention (the tenth to sixteenth aspects) can illuminate the illuminated object in the arcuate pattern with a uniform numerical aperture while maintaining the telecentricity under the Köhler illumination. Therefore, exposure apparatus provided with the illuminating apparatus of the present invention (the tenth to sixteenth aspects) can obtain an image in a uniform resolution over the entire arcuate surface as the illuminated surface, so that the pattern on the mask located at the illuminated surface can be accurately transferred with high throughput onto the substrate.

BRIEF DESCRIPTION OF THE DRAWINGS

FIGS. 2A and 2B show the optical system of the illuminating apparatus (an example) according to the present invention (the first to fourth aspects), wherein FIG. 2A is a cross section in the meridional section in the sagittal direction, of the optical direction, of the optical system and FIG. 2B a cross section in the sagittal direction, of the optical system;

FIGS. 3A to 3C show an example of the reflection type optical integrator according to the present invention (the first to fourth aspects), wherein FIG. 3A is a plan view of the integrator, FIG. 3B a cross section thereof, and FIG. 3C a plan view of the light source image (or light source) formed by the reflection type optical integrator;

FIGS. 7A and 7B show an optical system of a conventional illuminating apparatus (an example), wherein FIG. 7A is a cross section in the meridional direction, of the optical system and FIG. 7B is a cross section in the sagittal direction, of the optical system;

FIGS. 8A to 8C show a fly's eye mirror as an example of the conventional reflection type optical integrator (having no anisotropy of divergent angle), wherein FIG. 8A is a plan view of the fly's eye mirror, FIG. 8B is a cross section thereof, and FIG. 8C is a plan view of the light source image (or light source) formed by the mirror;

FIGS. 9A to 9C shows another fly's eye mirror as an example of the conventional reflection type optical integrator (having largely different divergen angles depending upon the direction), wherein FIG. 9A is a plan view of the fly's eye mirror, FIG. 9B1 and FIG. 9B2 are cross sections thereof, and FIG. 9C is plan view of the light source image (or light source) formed the by mirror;

FIGS. 17A and 17B are drawings to show cross sections of parallel beams in the conventional illuminating apparatus, wherein FIG. 17A is a cross section of parallel beams emitted at the exit angle of 0° from the light source image (or light source) 1 and FIG. 17B is a cross section of parallel beams emitted at an exit angle of θ from the light source image (or light source) 1;

FIGS. 24A and 24B are drawings to show cross sections of parallel beams in the conventional illuminating apparatus, wherein FIG. 24A is a cross section of parallel beams emitted at the exit angle of 0° from the light source image (or light source) 1 and FIG. 24B is a cross section of parallel beams emitted at an exit angle of θ from the light source image (or light source) 1;

DETAILED DESCRIPTION OF THE PREFERRED EMBODIMENTS

Embodiment 1

Figure 1:
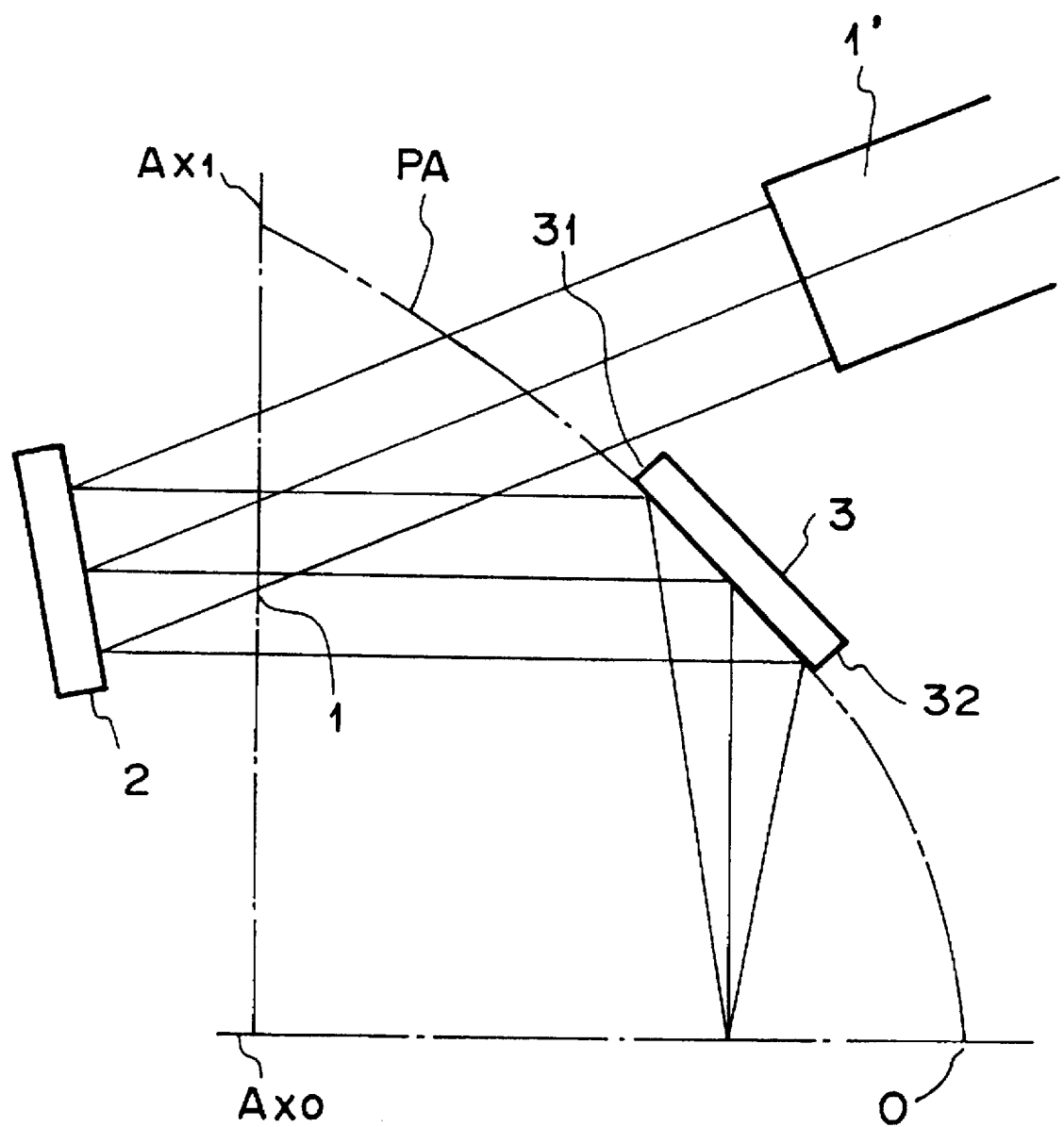
FIG. 1 shows an optical system of an illuminating apparatus (an example) according to the present invention (the first to fourth aspects) and is a cross section in the meridional direction, of the light source portion 1', reflection type optical integrator 2, light source image (or light source) 1, and special reflecting mirror (condensing optical system) 3.
Figure 2A:
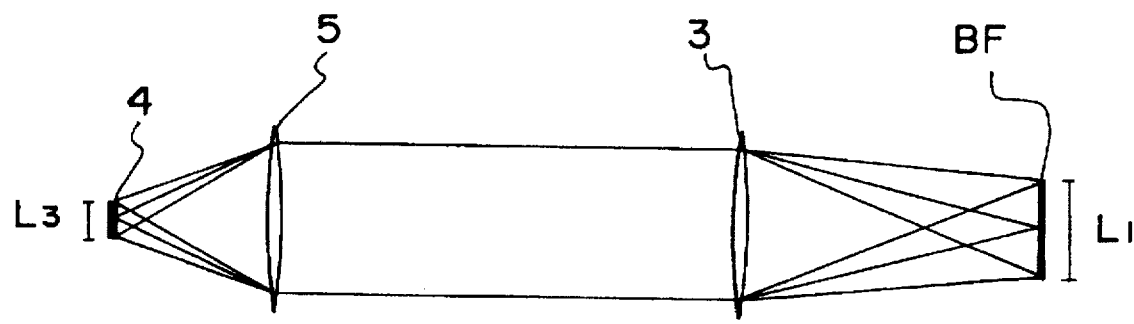
Figure 2B:
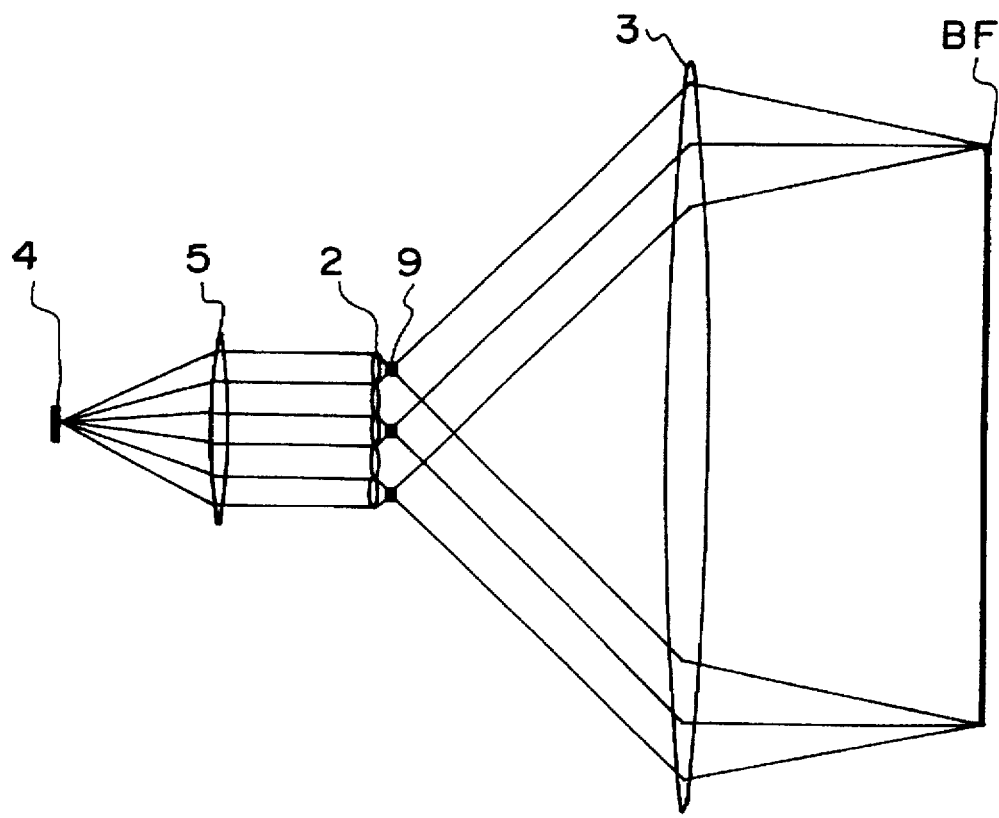

The illuminating apparatus of the present embodiment is composed of an optical system having the light source portion 1' and the reflection type optical integrator 2, and the parabolic-toric surface mirror (an example of the condensing optical system) 3 being the special reflecting mirror consisting of a part of the parabolic-toric body of rotation (FIG. 1).

Figure 5:
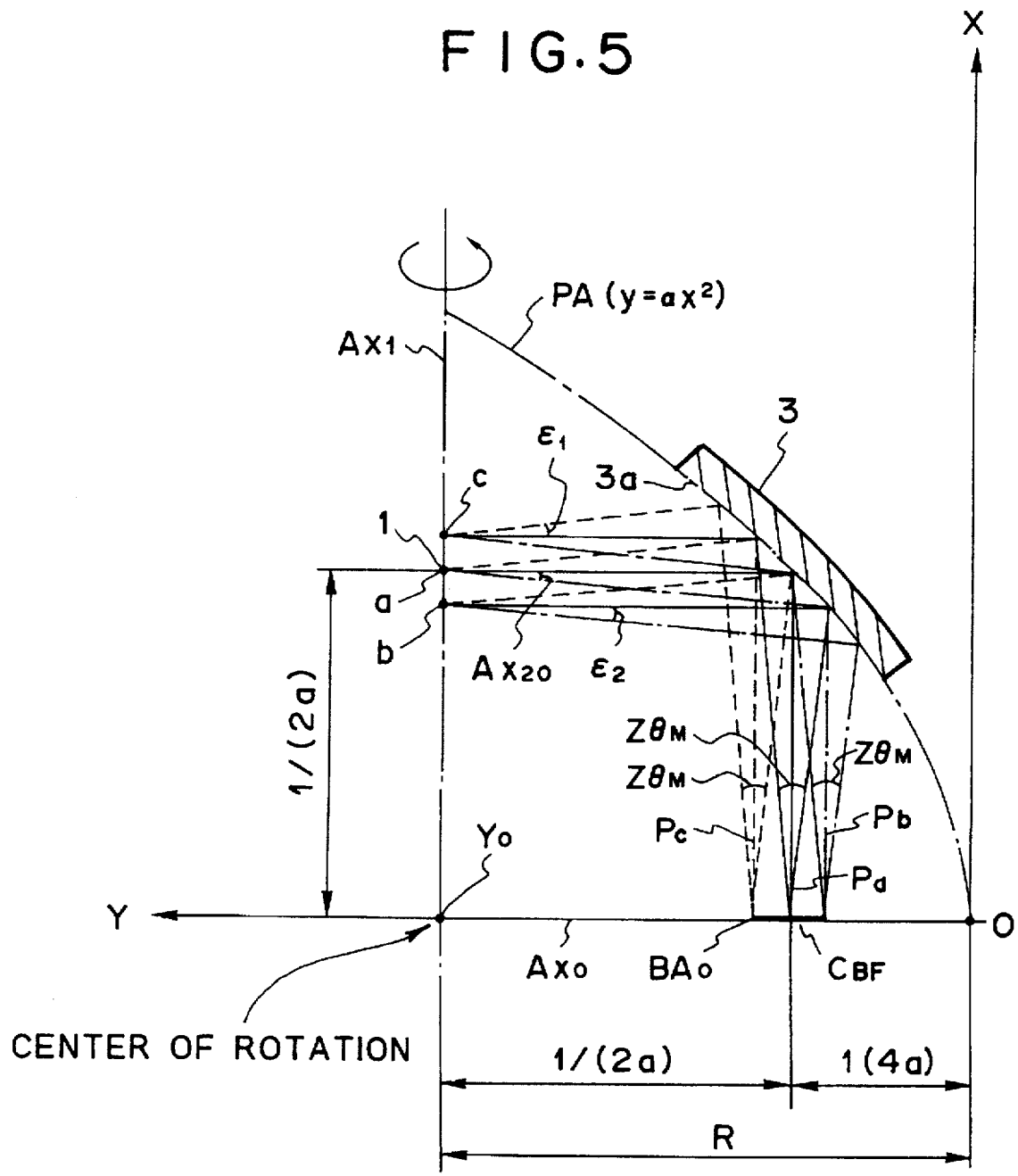
FIG. 5 shows the optical system (an example) of the illuminating apparatus according to the present invention (the first to sixteenth aspects) and is a cross section in the meridional direction, of the light source image (or light source) 1, special reflecting mirror (condensing optical system) 3, and region $BA_0$ in the illuminated surface.
Figure 6:
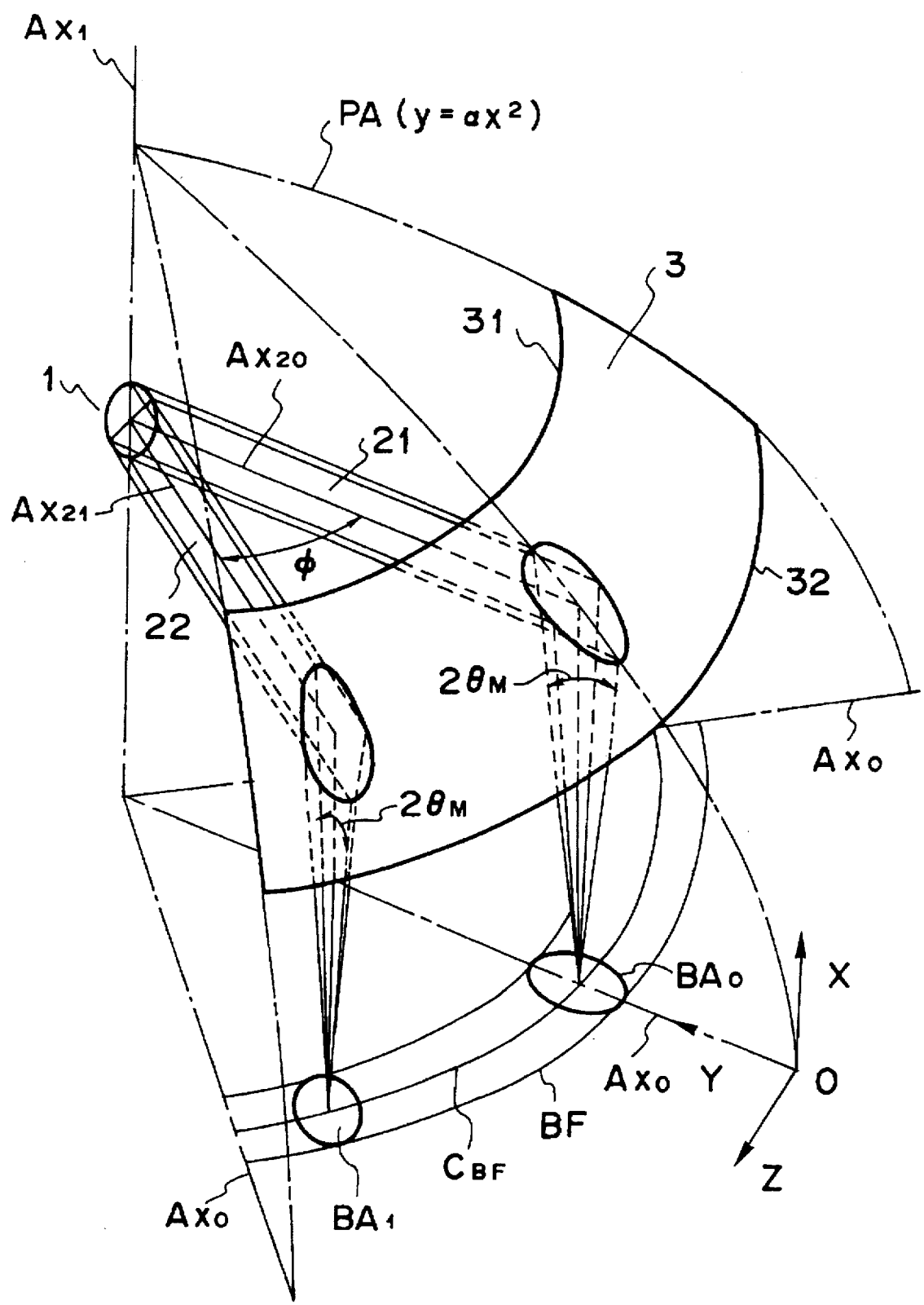
FIG. 6 shows the optical system (an example) of the illuminating apparatus according to the present invention (the first to sixteenth aspects) and is a perspective view of the light source image (or light source) 1, special reflecting mirror (condensing optical system) 3, and arcuate illuminated region BF.
Figure 7A:
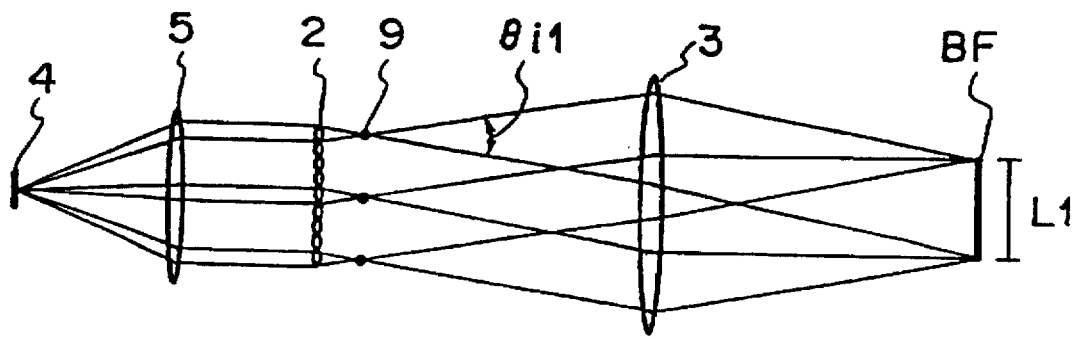
Figure 7B:
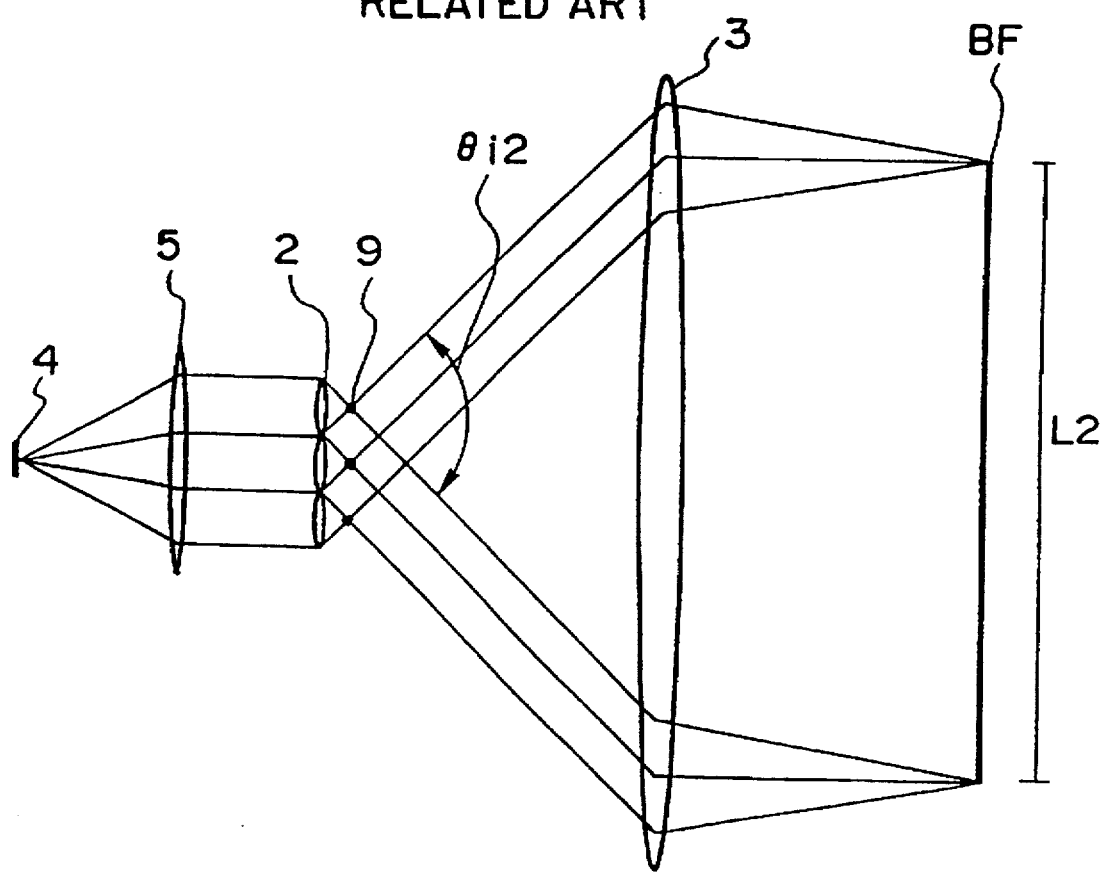
Figure 8A:
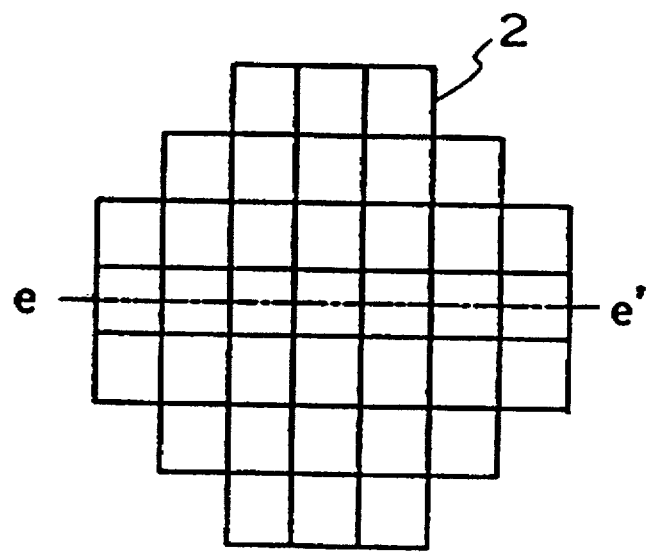
Figure 8B:
Figure 8C:
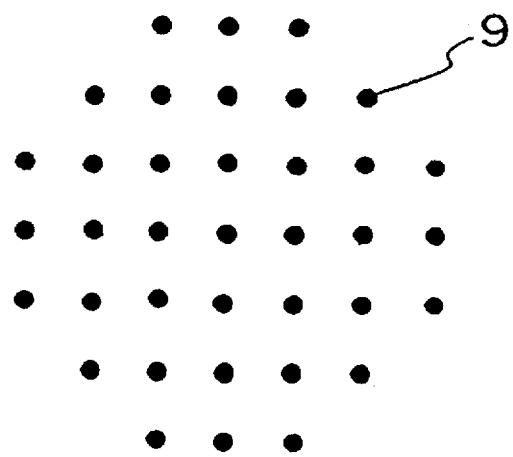
Figure 10:
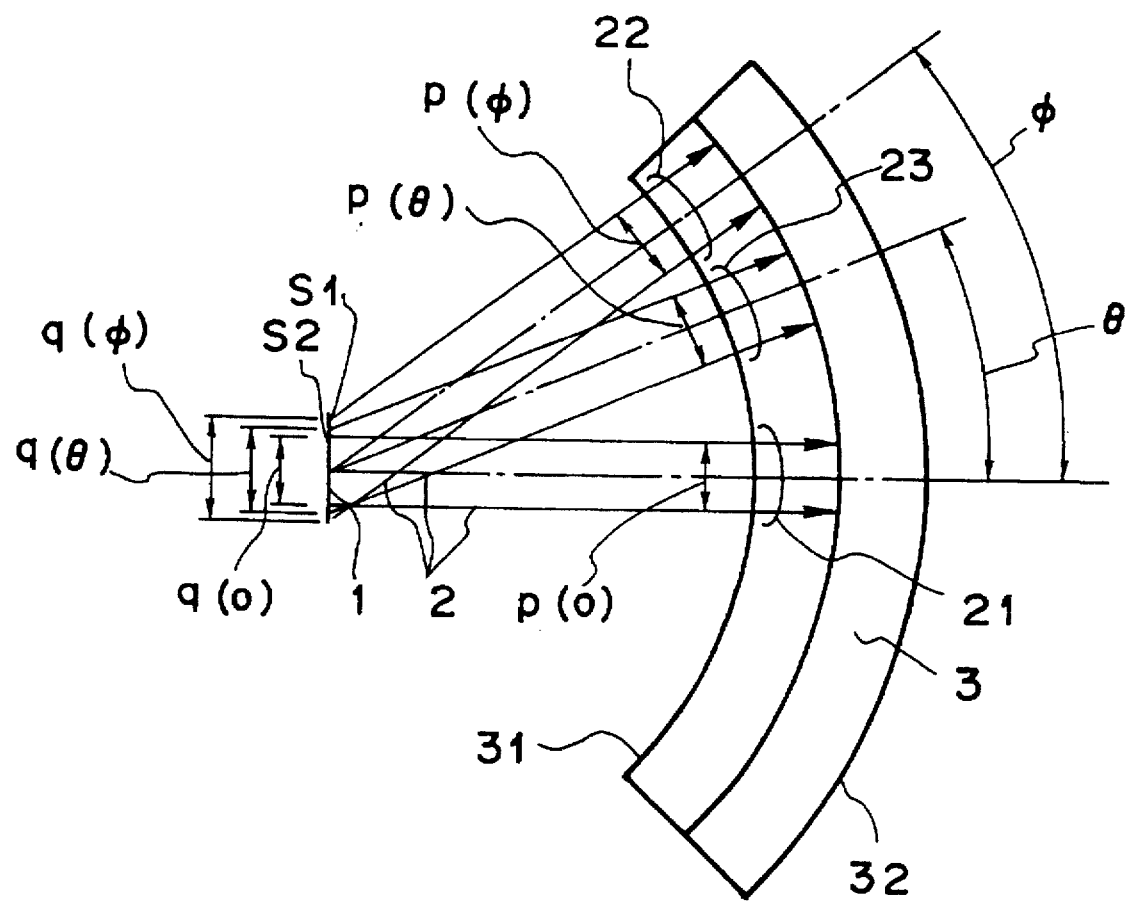
FIG. 10 shows an optical system (an example) of the illuminating apparatus according to the present invention (the fifth to ninth aspects) and is a partial cross section in the sagittal direction, of the light source image (or light source) 1, and the condensing optical system consisting of the special reflecting mirror 3.

As shown in FIG. 5, the cross section in the meridional direction, of the special reflecting mirror 3 is a part of parabola PA and this special reflecting mirror 3 is constructed of a part of a parabolic-toric body of rotation obtained by rotating the parabola about the base axis $Ax_1$ (an axis perpendicular to the symmetry axis Y) passing through the position $Y_0$ apart a predetermined distance along the symmetry axis Y from the vertex O. Namely, as shown in FIG. 6, the special reflecting mirror 3 has an arcuate shape composed of a part of a belt region between two latitudes 31, 32 of the parabolic-toric body of rotation.

Figure 3A:
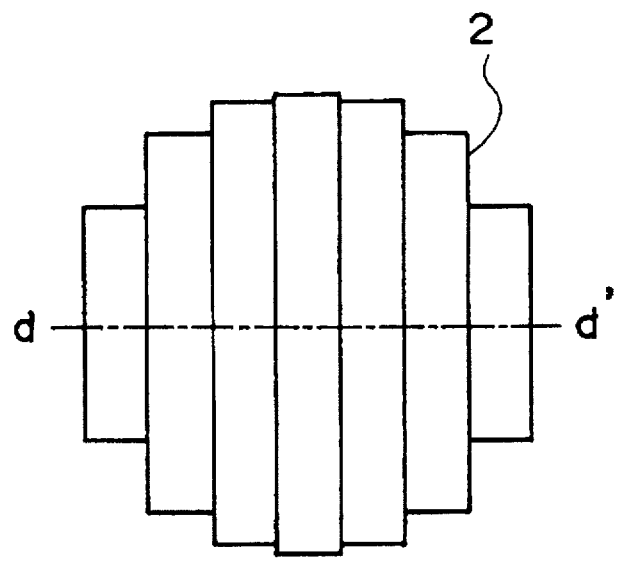
Figure 3B:

The light source portion 1' supplies parallel beams or nearly parallel beams, and the beams are incident on the reflection type optical integrator 2. The optical integrator 2 is constructed in such a manner that cylindrical reflecting surfaces (an example of curved surface mirrors) are continuously and integrally formed only in one direction, as shown in FIG. 3A and FIG. 3B (a cross section along d–d' in FIG. 3A).

Namely, the reflection type optical integrator 2 of the present embodiment is simpler in structure than the conventional reflection type optical integrator using the fly's eye mirror. It is not necessary to form small reflecting surfaces as in the fly's eye mirror in order to overcome the directional variations of resolution in the exposure apparatus. Therefore, the reflection type optical integrator 2 of the present embodiment is easier to produce.

Since the reflection type optical integrator 2 of the present embodiment is composed of a plurality of reflecting surfaces integrally formed, the X-ray reflectivity of the total illumination optical system is free of a great decrease as observed when a plurality of fly's eye mirrors are used as the reflection type optical integrator.

Figure 3C:
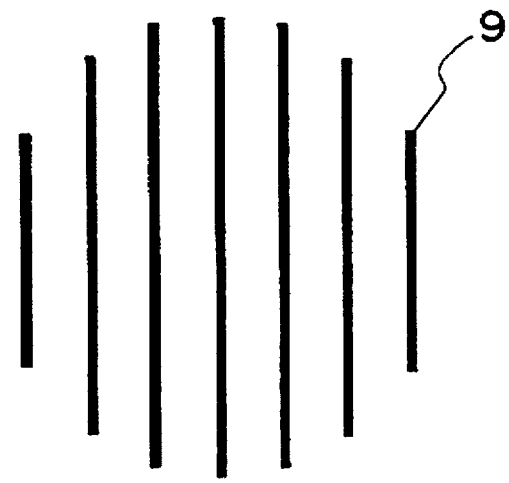

This reflection type optical integrator 2 converges the parallel beams incident thereto in linear patterns in the sagittal direction on the base axis $Ax_1$. Therefore, formed at a converging place is the light source image (or light source) 1 consisting of an assemblage of linear light sources 9 in the number corresponding to the number of the cylindrical reflecting surfaces (an example of curved surface mirrors) (FIG. 3C).

Beams from the light source image (or light source) 1 thus formed are reflected and converged by the special reflecting mirror 3 to illuminate the illuminated surface in an arcuate pattern. The illuminated surface is illuminated under the critical illumination in the meridional direction (in the direction of the radius of the arc of the arcuate illuminated surface BF; in the direction parallel to the $Ax_0$ axis) so as to satisfy the uniformity of numerical aperture. Further, the illuminated surface BF is illuminated under the Köhler illumination in the sagittal direction while satisfying the uniformities of numerical aperture and illumination intensity simultaneously.

Figure 4:
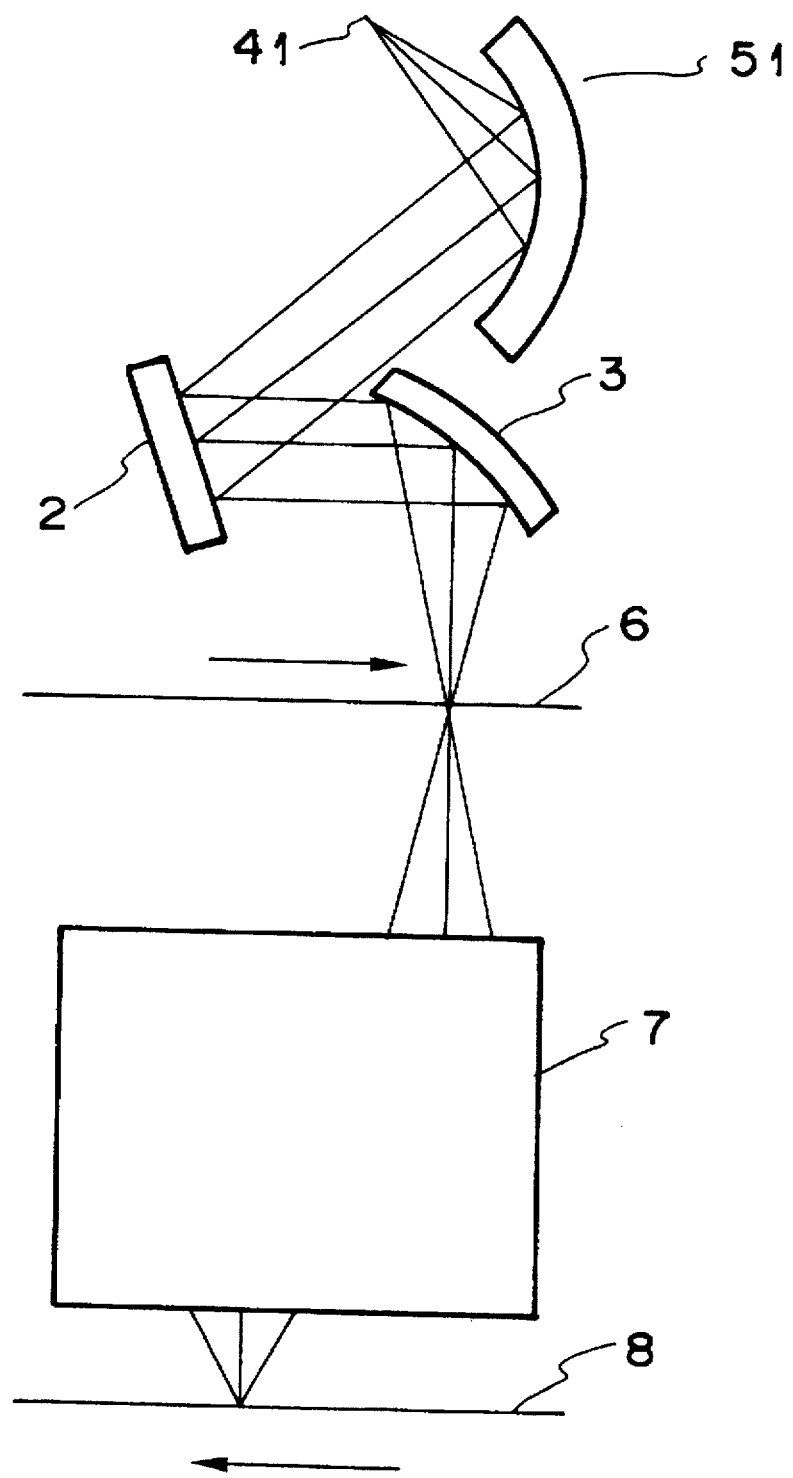
FIG. 4 is an explanatory drawing to show the structure and layout of the illuminating apparatus of Embodiment 1, and an exposure apparatus (an example) provided with the apparatus.

FIG. 4 is an explanatory drawing to show the structure and layout of the illuminating apparatus of the present embodiment, and an exposure apparatus (an example) provided with the illuminating apparatus.

The light source portion is composed of a laser plasma X-ray source 41 and a paraboloidal mirror 51. The laser plasma X-ray source 41 is a point light source having the light source size of about 100 μm, from which X-rays diverge nearly isotropically. When the paraboloidal mirror 51 reflects the diverging beams, the X-rays diverging from the laser plasma X-ray source 41 are converted into parallel beams in a desired cross section. By this, parallel beams or nearly parallel beams with high intensity are supplied. The beams are incident to the reflection type optical integrator 2.

It is noted that the system for supplying the parallel beams should not be limited to the combination of the light source with the curved surface mirror such as the paraboloidal mirror, as described above. For example, when the light source is one emitting nearly parallel beams such as the synchrotron radiation source, the radiation can be directly guided from the light source to the reflection optical integrator 2.

When the laser plasma X-ray source is used, nearly parallel beams can be directly guided from the light source to the optical integrator 2 without using the paraboloidal mirror if the laser plasma X-ray source is set fully away from the integrator 2. However, the arrangement of the present embodiment is preferred in that case, because the spatial utility factor or efficiency of light becomes much higher.

As described, the light source portion supplies the parallel beams or nearly parallel beams, and the beams are incident on the reflection type optical integrator 2. X-rays outgoing from the reflection type optical integrator 2 are reflected by the special reflecting mirror 3 to illuminate the mask 6 in an arcuate pattern.

In this case, the width of the arcuate illuminated surface (the width in the meridional direction) was set smaller than the width from which a good image was obtained through the imaging apparatus 7. The illuminated surface (mask surface) was illuminated under the critical illumination in the meridional direction so as to satisfy the uniformity of numerical aperture. Also, the illuminated surface was illuminated under the Köhler illumination in the sagittal direction so as to satisfy the uniformities of numerical aperture and illumination intensity at a time.

The magnification in the meridional direction, of the illumination optical system of the illuminating apparatus (the magnification of the critical illumination optical system) was 20. Since the light source size of the laser plasma X-ray source was about 100 μm, the width of the illumination region (arcuate pattern) on the mask as the illuminated surface (the meridional width) was about 2 mm.

Since the width for obtaining a good image was about 2 mm for the imaging apparatus 7 in the present embodiment, most illumination light was guided into the imaging optical system of the imaging apparatus to contribute to image formation. In the imaging apparatus 7, the light that illuminates regions except for the region for obtaining a good image needs to be removed for example by a slit or the like (not shown). However, in the case of the present embodiment, the light (X-rays) to be removed by the slit or the like was extremely little, because the width of the illumination region (arcuate pattern) on the mask as the illuminated surface (the meridional width) was approximately equal (about 2 mm) to the width for obtaining a good image through the imaging apparatus 7. Therefore, the spatial utility factor of X-rays is high in the present embodiment.

X-rays transmitted by the mask 6 were guided through the imaging apparatus 7 of the magnification ¼ to be irradiated onto the substrate 8. On this occasion, the pattern on the mask 6 was transferred onto the substrate 8. In the present embodiment the substrate was a silicon wafer and a photoresist laid on the surface thereof was exposed to X-rays. In this state, moving the mask 6 and substrate 8 in the directions of the arrows shown in FIG. 4, the pattern on the entire surface of mask was transferred onto the substrate.

In the present embodiment, the frequency of pulse emission of the laser plasma X-ray source was 500 Hz and the moving speed of mask was 24 mm/sec. Since the width in the moving direction, of the illumination light (the meridional width) is about 2 mm, each point on the mask is illuminated by about 40 pulses of X-rays by scanning. Since the laser plasma X-ray source is not always uniform in spatial and temporal intensity distributions, the X-ray intensity of each pulse is not constant. However, because each point on the mask is illuminated by a lot of pulses upon scanning as described above, an integral value thereof is constant at each point on the mask, thereby enabling it to be illuminated it with uniform intensity.

As a result, patterns with a minimum pattern size of 0.1 μm were obtained throughout a large area (about 10 cm²) on the substrate by scanning the arcuate exposure region of length 30 mm by about 35 mm on the substrate. The fact that such fine patterns were obtained in a large area shows that the illuminating apparatus of the present invention has sufficient performance as the illuminating apparatus for the exposure apparatus. Further, because of the capability of exposure over a large area, the throughput of the exposure apparatus was greatly improved.

If the synchrotron radiation source is used as the system for supplying the parallel beams, the width of illumination light (the meridional width) becomes smaller, because the magnification of the critical illumination optical system in the meridional direction of the illuminating apparatus becomes considerably smaller than 1; but no exposure variations appear in the scanning direction because the synchrotron radiation source is a continuously emitting source.

Although in the present embodiment the magnification of the critical illumination optical system in the meridional direction of the illuminating apparatus was 20, the present invention is not limited to it. For example, the magnification may be set larger than it. In that case, the light-source-side numerical aperture becomes large in the meridional cross section, so that in the case of a diverging light source such as the laser plasma X-ray source, diverging X-rays can be taken in at a large solid angle into the illuminating apparatus, thereby increasing the intensity of illumination light.

The present embodiment employed the slit in the illuminating apparatus, but the slit may be omitted if the width of the arc of the arcuate illumination region (the meridional width) is set sufficiently smaller than the width for obtaining a good image by the imaging apparatus. The width of the arc can be easily set by adjusting the magnification of the illumination optical system.

The reflection type optical integrator of the present embodiment is easier to produce than the conventional ones and has no great decrease of X-ray reflectivity.

With the illuminating apparatus provided with such a reflection type optical integrator, the illuminated surface was illuminated under the critical illumination in the meridional direction so as to satisfy the uniformity of numerical aperture. Further, the illuminated surface was illuminated under the Köhler illumination in the sagittal direction so as to satisfy the uniformities of numerical aperture and illumination intensity at a simultaneously.

Namely, the illuminating apparatus of the present embodiment was able to illuminate the illuminated surface in the arcuate pattern with uniform intensity. Therefore, an exposure apparatus provided with the illuminating apparatus of the present embodiment was able to obtain an image with uniform exposure over the entire arcuate surface as the illuminated surface, so that the pattern on the mask located on the illuminated surface was able to be accurately transferred with high throughput onto the substrate.

The present embodiment used the transmission type mask as the mask, but the same effects were also achieved using a reflection type mask.

In the present embodiment, the wavelength of X-rays was 13 nm, and the reflective surfaces of the reflection type optical integrator and special reflecting mirror were coated with an X-ray reflecting multilayer film (a lamination of a plurality of alternate layers of molybdenum and silicon) for improving the reflectivity.

Embodiment 2

Figure 13:
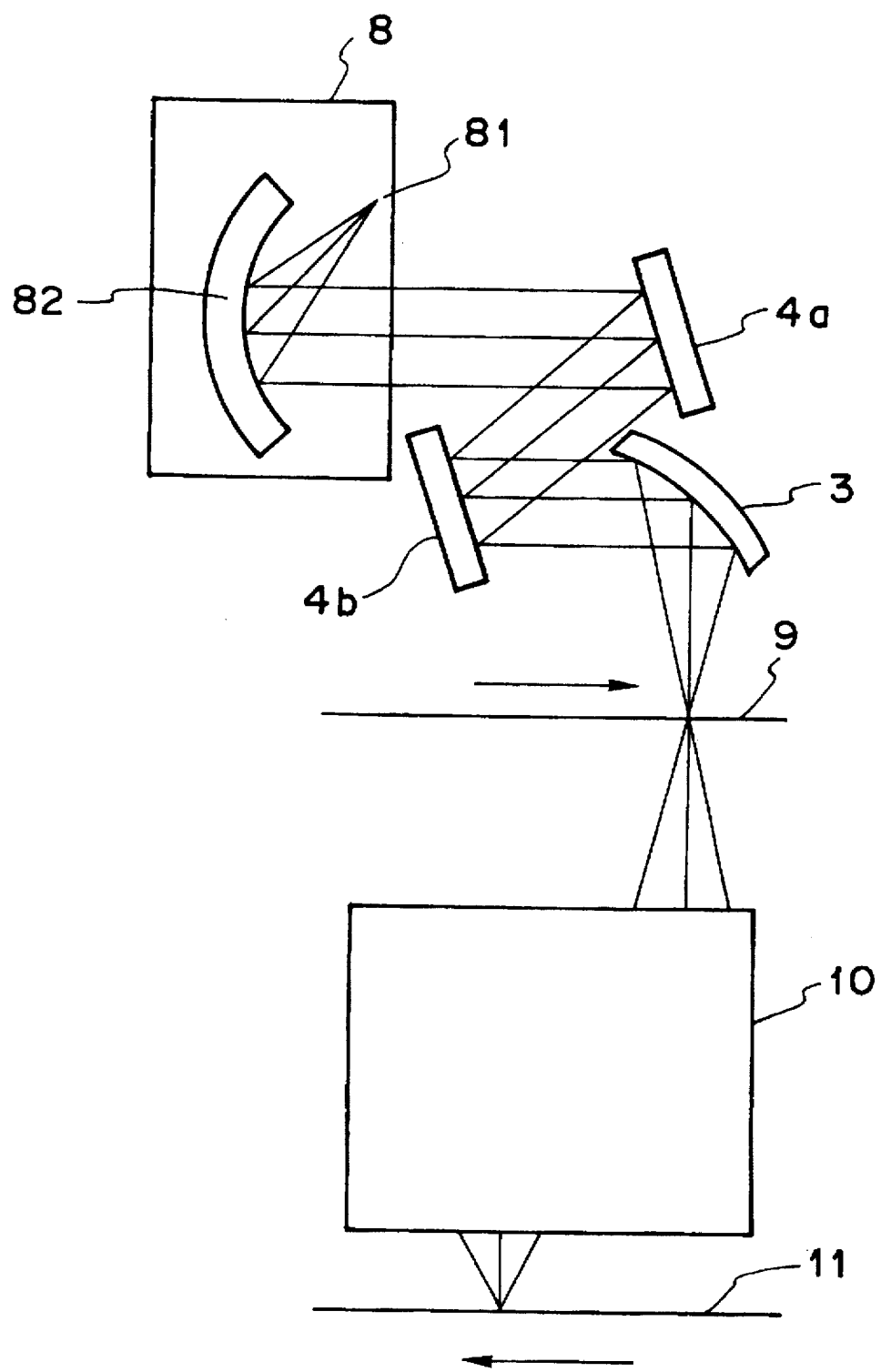
FIG. 13 is an explanatory drawing to show the structure and layout of an exposure apparatus (an example) provided with the illuminating apparatus of Embodiment 2 or Embodiment 3.

FIG. 13 is an explanatory drawing to show the structure and layout of the illuminating apparatus of the present embodiment, and an exposure apparatus (an example) provided with the illuminating apparatus.

The illuminating apparatus of the present embodiment is composed of a light source system having a light source portion 8 and reflection type optical integrators 4a, 4b, and a parabolic-toric mirror (an example of condensing optical system) 3 which is the special reflecting mirror composed of a parabolic-toric body of rotation.

As shown in FIG. 5, the cross section in the meridional direction, of the special reflecting mirror 3 according to the present invention is a part of parabola PA, and this special reflecting mirror 3 is constructed of a part of a parabolic-toric body of rotation obtained by rotating the parabola about the base axis $Ax_1$ (an axis perpendicular to the symmetry axis Y) passing through the position $Y_0$ that is a predetermined distance along the symmetry axis Y from the vertex O. Namely, as shown in FIG. 6, the special reflecting mirror 3 has an arcuate shape composed of a part of a belt region between two latitudes 31, 32 of the parabolic-toric body of rotation.

The light source portion 8 is composed of a laser plasma X-ray source 81 and a paraboloidal mirror 82. The laser plasma X-ray source 81 is a point light source having the light source size of about 100 μm, from which X-rays diverge nearly isotropically. Reflecting the diverging light by the paraboloidal mirror 82, the X-rays diverging from the laser plasma X-ray source 81 can be converted into parallel beams in a desired cross section. By this, parallel beams or nearly parallel beams with high intensity are supplied. The beams are incident to the reflection type optical integrator 4a.

It is noted that the system for supplying the parallel beams is not limited to the combination of the light source with the curved surface mirror such as the paraboloidal mirror as described above. For example, if the light source is one emitting nearly parallel beams such as the synchrotron radiation source, the beams may be directly guided from the light source to the reflection type optical integrator 4a.

If the laser plasma X-ray source is used, nearly parallel beams can be guided directly from the light source to the integrator 4a without using the paraboloidal mirror but by placing the laser plasma X-ray source fully away from the integrator 4a. However, the arrangement of the present embodiment is preferred also in that case, because the spatial utility factor of light becomes much higher.

As described, the light source portion 8 supplies the parallel beams or nearly parallel beams, the beams are incident on the reflection type optical integrator 4a, and further, beams reflected thereby are incident on the reflection type optical integrator 4b.

Figure 14A:
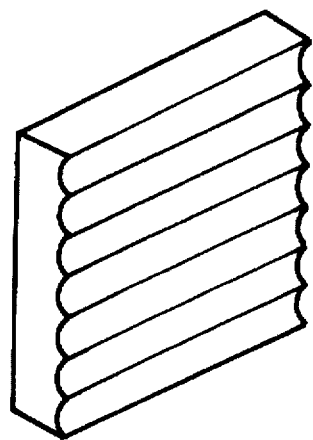
FIGS. 14A and 14B are perspective views to show an example of the optical integrator.
Figure 14B:
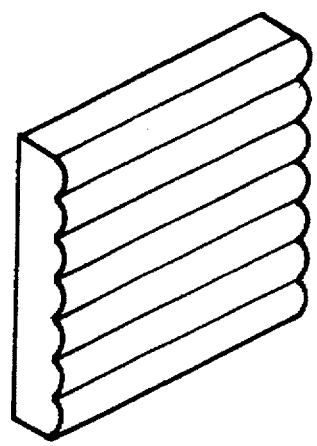
Figure 15:
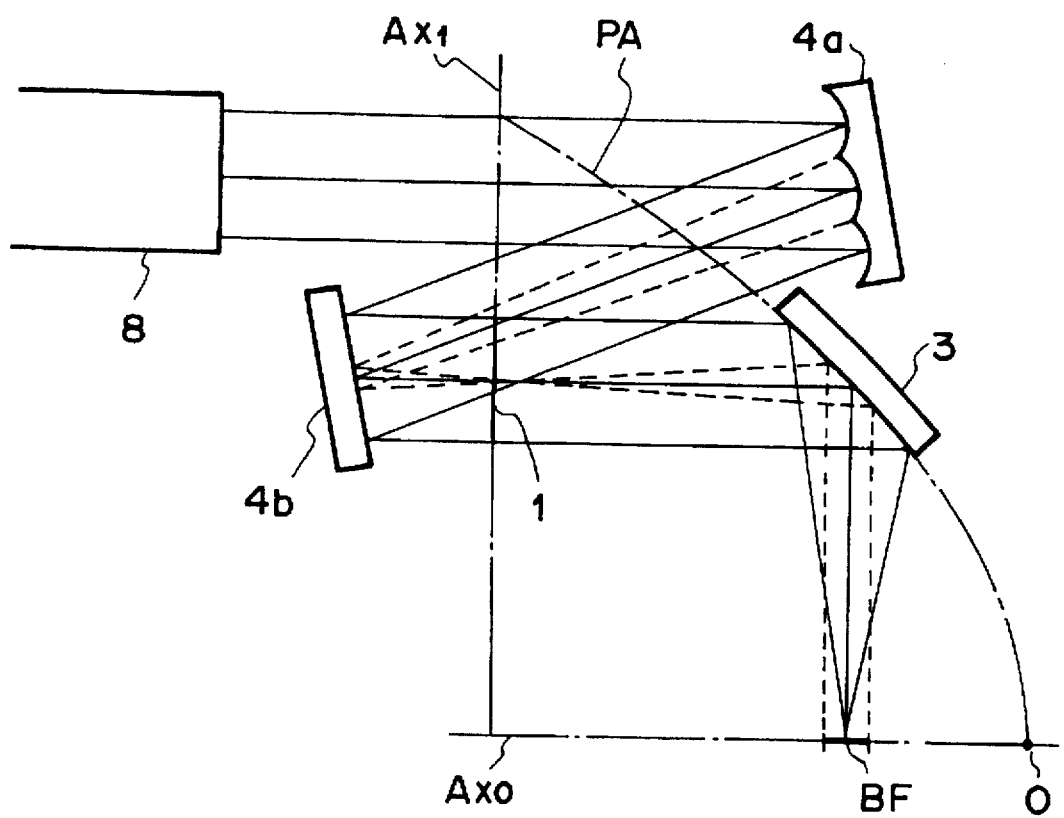
FIG. 15 is a cross section in the meridional direction, of a conventional illuminating apparatus.
Figure 16:
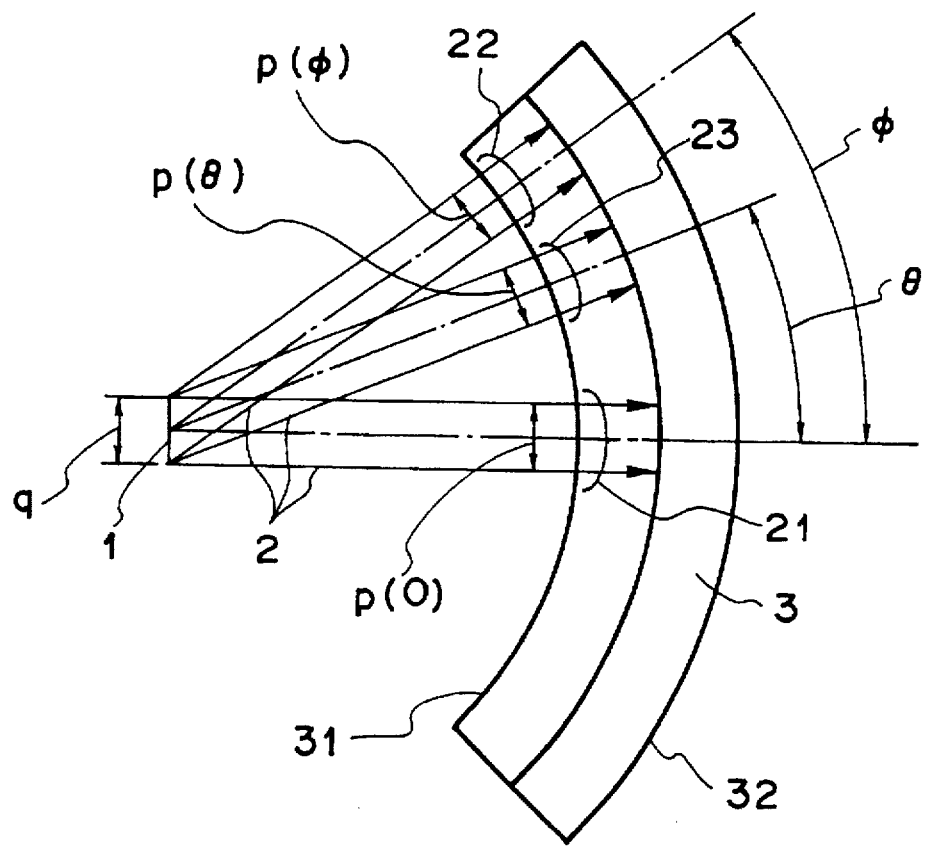
FIG. 16 shows an optical system (an example) of a conventional illuminating apparatus and is a partial cross section in the sagittal direction, of the light source image (or light source) 1, and the condensing optical system consisting of the reflecting mirror 3.
Figure 17A:
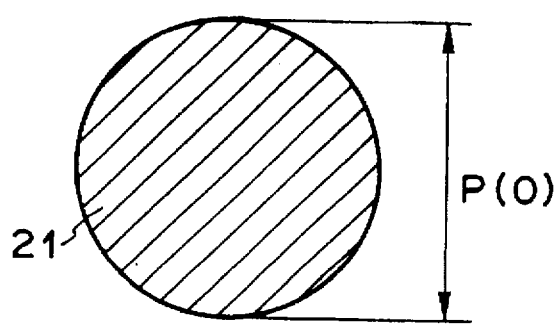
Figure 17B:
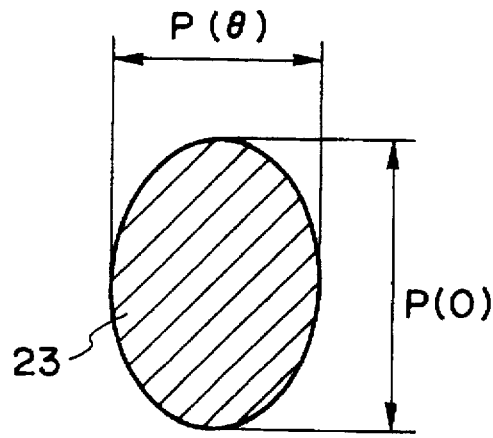
Figure 18:
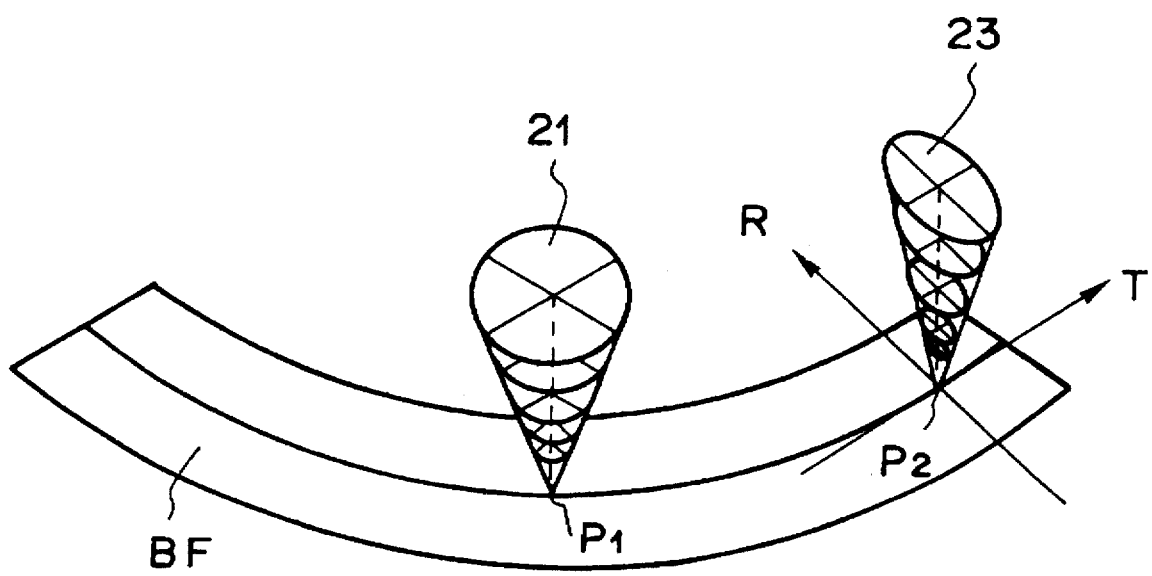
FIG. 18 is an explanatory drawing to show a state of beams converged on the illuminated surface in the conventional illuminating apparatus.
Figure 19:
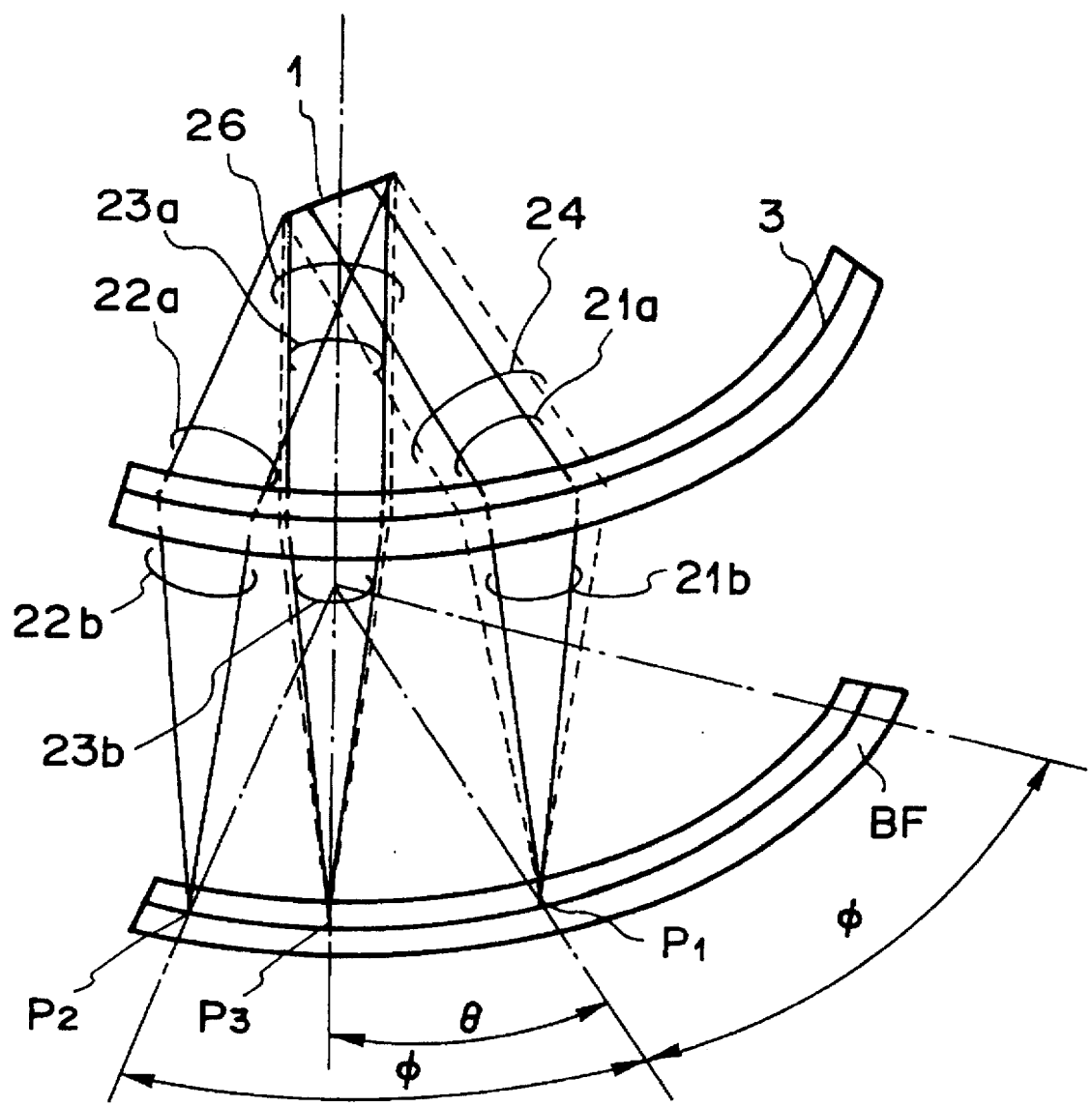
FIG. 19 shows an optical system (an example) of the illuminating apparatus according to the present invention (the tenth to sixteenth aspects) and is a perspective view of the light source image (or light source) 1, special reflecting mirror (an example of condensing optical system) 3, and arcuate illumination region BF.
Figure 20:
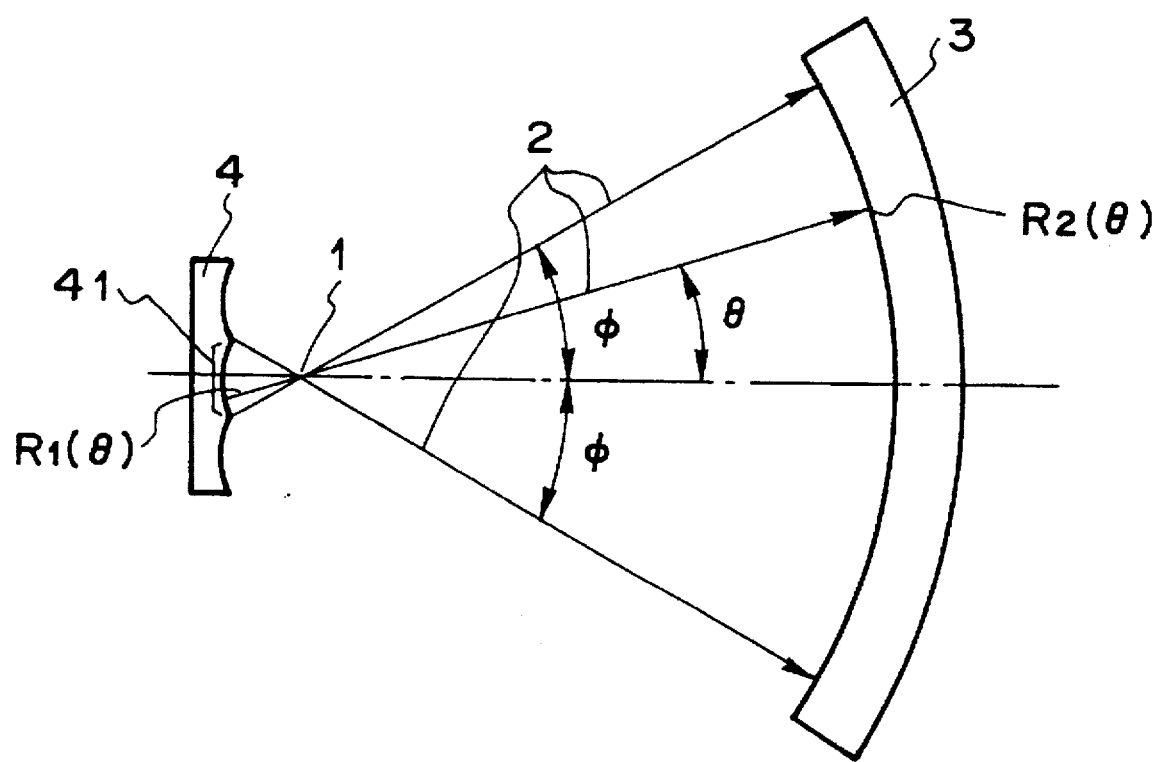
FIG. 20 shows an optical system (an example) of the illuminating apparatus according to the present invention (the tenth to sixteenth aspects) and is a cross section in the sagittal direction, of the reflection type optical integrator 4 and special reflecting mirror 3.

The reflection type optical integrator 4a is composed of an assemblage of cylindrical mirrors having a plurality of concave surfaces as shown in FIG. 14A, and converges parallel beams incident thereon in the meridional direction. The reflection type optical integrator 4b is composed of an assemblage of cylindrical mirrors having a plurality of a convex surfaces as shown in FIG. 14B, and converges parallel beams incident thereon in the sagittal direction.

Figure 11:
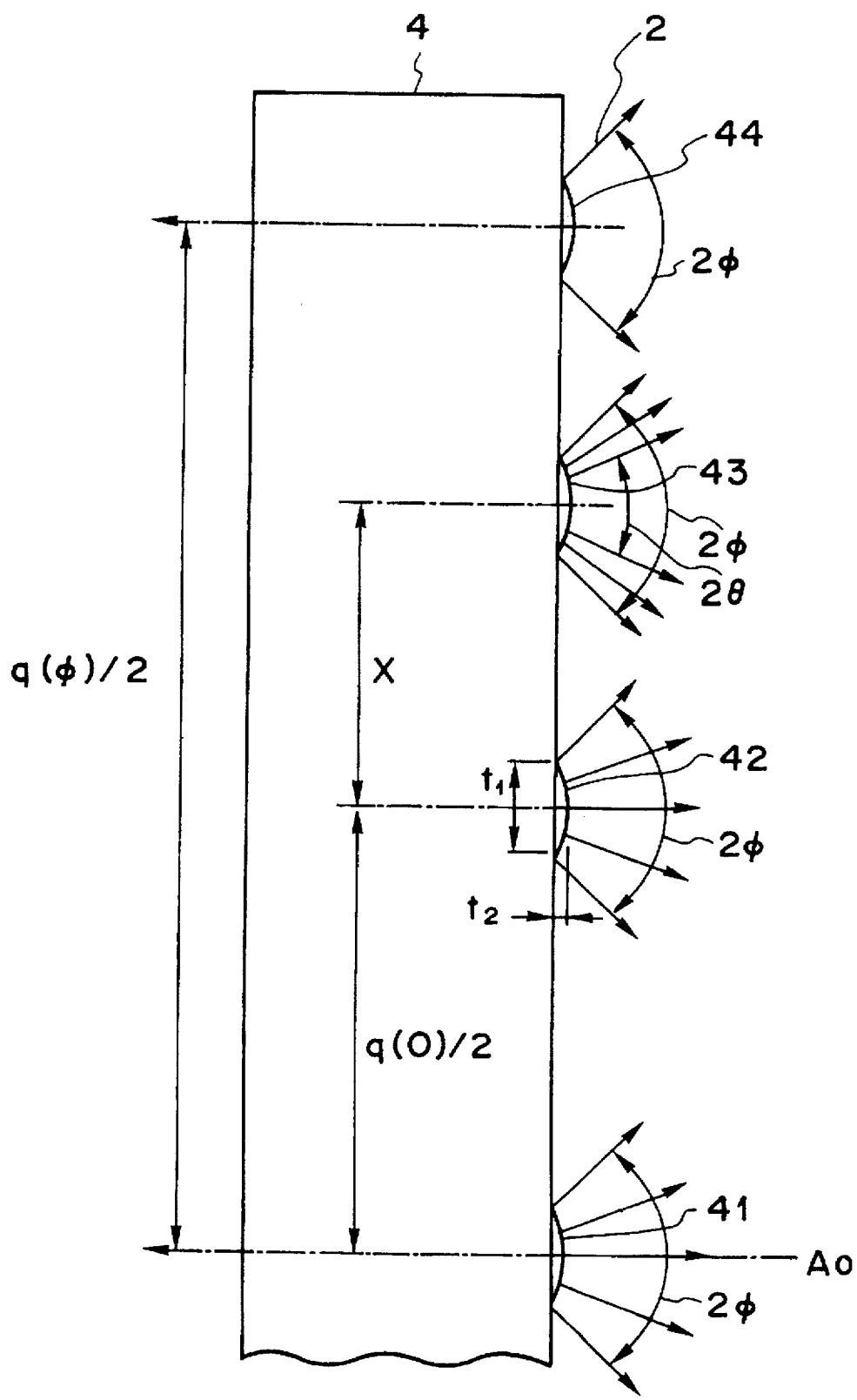
FIG. 11 shows an example of the optical integrator according to the illuminating apparatus of the present invention (the fifth to ninth aspects) and is a partial cross section in the sagittal direction, of the optical integrator.

For example, when the diameter $t_1$ (FIG. 11) of the cylindrical mirrors constituting the reflection type optical integrator 4b is about 22 μm and the height $t_2$ about 1.5 μm, a divergent angle thereof 2φ is about 60°.

Figure 12:
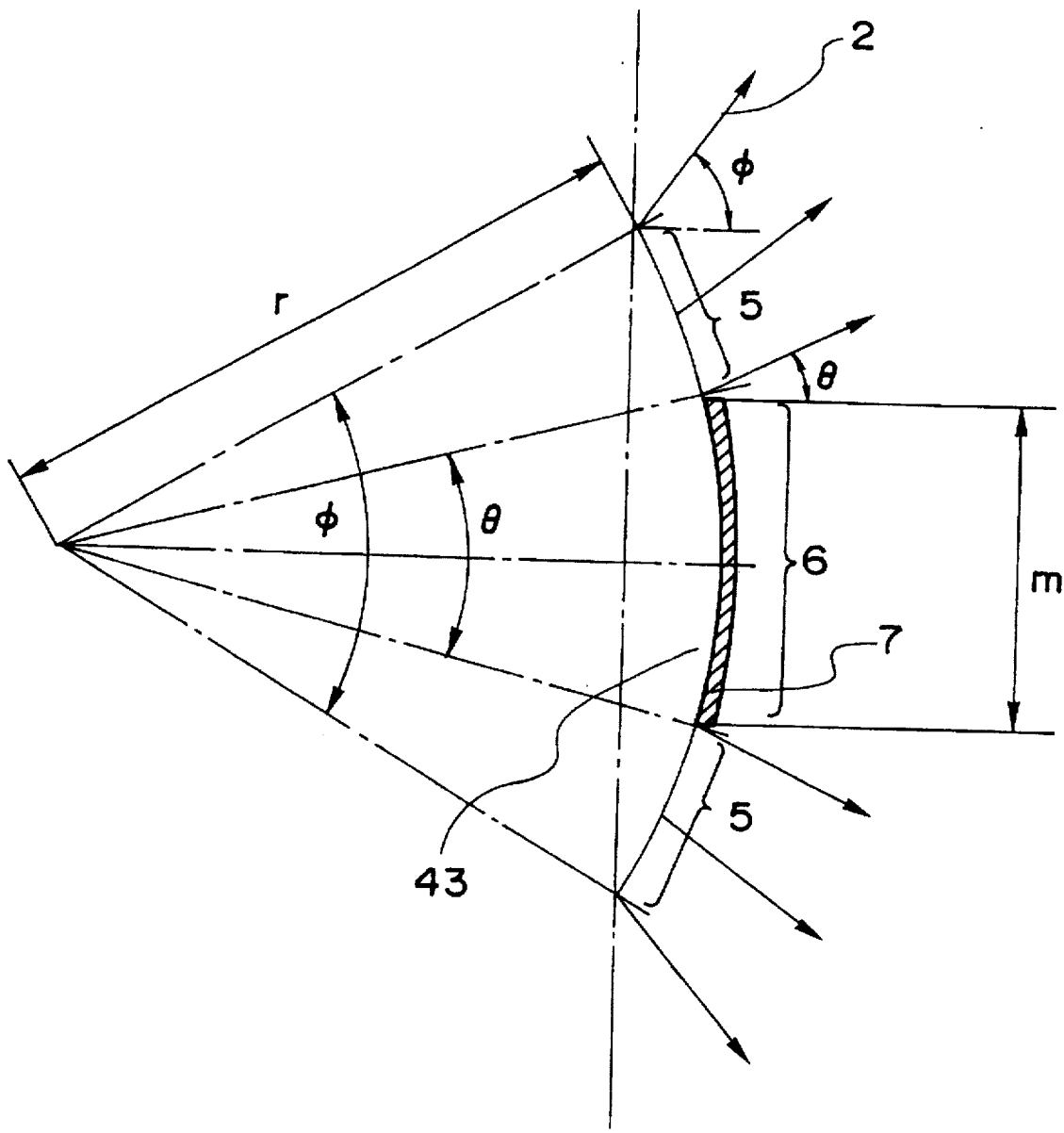
FIG. 12 is a cross section in the sagittal direction, of a curved surface reflecting mirror constituting the optical integrator as an example of the optical integrator according to the illuminating apparatus of the present invention (the fifth to ninth aspects)

The reflection type optical integrator 4b is provided, as shown in FIG. 12, with a non-reflecting region (non-reflecting portion) 6 on the reflecting surfaces. In the present embodiment, this non-reflecting region 6 was formed from an X-ray absorbing member (a layer of nickel film in the film thickness of about 40 nm) 7. When the wavelength of X-rays was 13 nm, the reflectivity by the absorbing member was decreased to one hundredth or less of the reflectivity by the reflecting surfaces.

In the present embodiment the absorbing member was formed by the lift-off process. In more detail, a desired resist pattern was formed over the surface of the reflection type optical integrator 4b, a mask pattern was formed in regions except for surface regions where the absorbing member was to be formed, and a thin film of the absorbing member was formed by a vacuum thin film forming method such as the vapor deposition or sputtering method. Then, removing the resist and the thin film laid on the resist, for example, with a solvent, the absorbing member was formed in desired patterns.

The resist pattern was able to be produced as a very precise pattern using the stepper or the like. Thus, the width m of the absorbing member (FIG. 12) was able to be controlled precisely. Because of it, the width P(θ) of the parallel beams after having diverged from the light source image (or light source) was also able to be kept uniform with high accuracy.

Namely, parallel beams having an equal cross section were emitted in respective directions from the light source image (or light source) formed by the optical integrator.

The beams from the light source image (or light source) formed by the reflection type optical integrators 4a, 4b were reflected and converged by the special reflecting mirror 3. By this, the illuminated surface (the surface of mask 9) was illuminated in an arcuate pattern under the Köhler illumination, and in addition, the illuminated surface was illuminated with a uniform numerical aperture.

The X-rays transmitted by the mask 9 were guided through the imaging apparatus 10 onto the substrate 11. On this occasion, the pattern on the mask 9 was transferred onto the substrate 11. The present embodiment used a silicon wafer as the substrate, and a photoresist laid on the surface thereof was exposed to the X-rays. In this state, moving the mask 9 and substrate 11 in the directions of the arrows shown in FIG. 13, the pattern on the entire mask surface was transferred onto the substrate.

As a result, patterns of a minimum pattern size of 0.1 μm were able to be obtained over a large area (about 10 cm$^2$) on the substrate. When the exposure apparatus provided with the conventional illuminating apparatus were used, the resolution was not uniform because of the non uniformity of numerical aperture of illumination light, which made it very difficult to obtain fine patterns over a large area as achieved above.

The fact that such fine patterns were obtained over a large area shows that the illuminating apparatus of the present invention has sufficient performance as the illuminating apparatus for exposure apparatus. Further, because of the capability of exposure over the large area, the throughput of exposure apparatus is largely improved.

Since the wavelength of the X-rays used as the exposure light was 13 nm, all the reflecting mirrors were coated with a multilayer film for improving the reflectivity (a lamination of a plurality of alternate layers of molybdenum and silicon). In this case, the mirrors may be coated with a lamination film of a plurality of alternate layers of molybdenum and a silicon compound (for example, silicon carbide) as a multilayer film with high heat resistance.

The present embodiment employed the transmission type mask as the mask but the same effects were also achieved using a reflection type mask.

Although the reflecting curved surfaces constituting the reflection type optical integrator were cylindrical mirrors in the present embodiment, they may be fly's eye mirrors. Although the present embodiment is an example in which the two reflection type optical integrators were used, the present invention is by no means limited to it. Namely, an illuminating apparatus arranged in such a manner that the non-reflecting portions are provided on the surface of the reflection type optical integrator so as to limit or adjust divergent angles thereof falls within the scope of the present invention.

Further, the absorbing member or non-reflecting portions of the optical integrator may be formed not only by the lift-off process, but also by the general photolithography.

Embodiment 3

FIG. 13 is an explanatory drawing to show the structure and layout of an illuminating apparatus of the present embodiment, and an exposure apparatus (an example) provided with the illuminating apparatus.

The illuminating apparatus of the present embodiment is composed of an optical system having the light source portion 8 and the reflection type optical integrators 4a, 4b, and the parabolic-toric mirror (an example of condensing optical system) 3 as the special reflecting mirror composed of a part of a parabolictoric body of rotation.

As shown in FIG. 5, the cross section in the meridional direction, of the special reflecting mirror 3 is a part of parabola PA, and this special reflecting mirror 3 is constructed of a part of a parabolic-toric body of rotation obtained by rotating the parabola about the base axis $Ax_1$ (an axis perpendicular to the symmetry axis Y) passing through the position $Y_0$ apart a predetermined distance along the symmetry axis Y from the vertex O. Namely, as shown in FIG. 6, the special reflecting mirror 3 has an arcuate shape composed of a part of a belt region between two latitudes 31, 32 of the parabolic-toric body of rotation.

The light source portion 8 was composed of the laser plasma X-ray source 81 and the paraboloidal mirror 82. The laser plasma X-ray source 81 is a point light source having the light source size of about 100 μm, from which X-rays diverge nearly isotropically. When the paraboloidal mirror 82 reflects the diverging beams, the X-rays diverging from the laser plasma X-ray source 81 can be converted into parallel beams in a desired cross section. By this, parallel beams or nearly parallel beams with high intensity are supplied. The beams are incident to the reflection type optical integrator 4a.

It is noted that the system for supplying the parallel beams is not limited to the combination of the light source with the curved surface mirror such as the paraboloidal mirror as in the above arrangement. For example, if the light source is one emitting nearly parallel beams, such as the synchrotron radiation source, the beams may be guided directly from the light source to the reflection type optical integrator 4a.

When the laser plasma X-ray source is used, nearly parallel beams can also be guided directly from the light source to the optical integrator 4a without using the paraboloidal mirror and by locating the laser plasma X-ray source fully away from the integrator 4a. However, the arrangement of the present embodiment is also preferable in that case, because the spatial utility factor of light becomes much higher.

As described, the light source portion 8 supplies parallel beams or nearly parallel beams, the beams are incident on the reflection type optical integrator 4a, and further, reflected beams thereby are incident on the reflection type optical integrator 4b.

The reflection type optical integrator 4a is composed of an assemblage of cylindrical mirrors having a plurality of concave surfaces as shown in FIG. 14A, and converges parallel beams incident thereon in the meridional direction. Further, the reflection type optical integrator 4b is composed of an assemblage of cylindrical mirrors having a plurality of convex surfaces as shown in FIG. 14B, and converges parallel beams incident thereon in the sagittal direction.

In the present embodiment the divergent angle $2\phi$ of the reflection type optical integrator 4b was 60°.

In the present embodiment, the wavelength of the X-rays was 13 nm, and the reflecting surfaces of the reflection type optical integrators and the special reflecting mirror were coated with an X-ray reflecting multilayer film for improving the reflectivity (a lamination of a plurality of alternate layers of molybdenum and silicon). Particularly, the reflecting mirrors constituting the reflection type optical integrator 4b were given a distribution of period lengths of the multilayer film changing against the exit angle $\theta$. Namely, the distribution was so arranged that the period length was larger in a portion with a larger exit angle, and the period lengths were changed between 6.7 and 6.95 nm.

Figure 21:
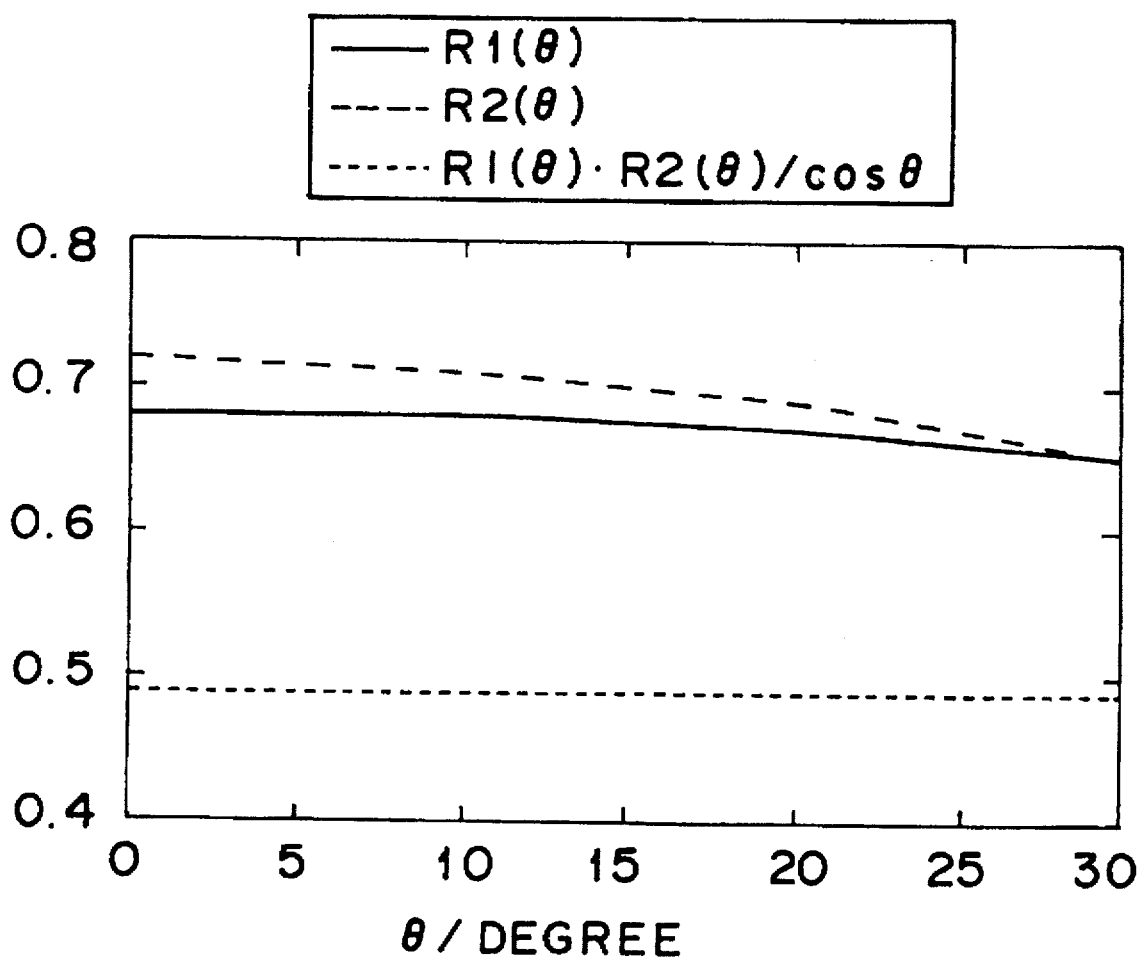
FIG. 21 is a data graph to show an X-ray intensity distribution in the illuminating apparatus according to the present invention (the tenth to sixteenth aspects)
Figure 22:
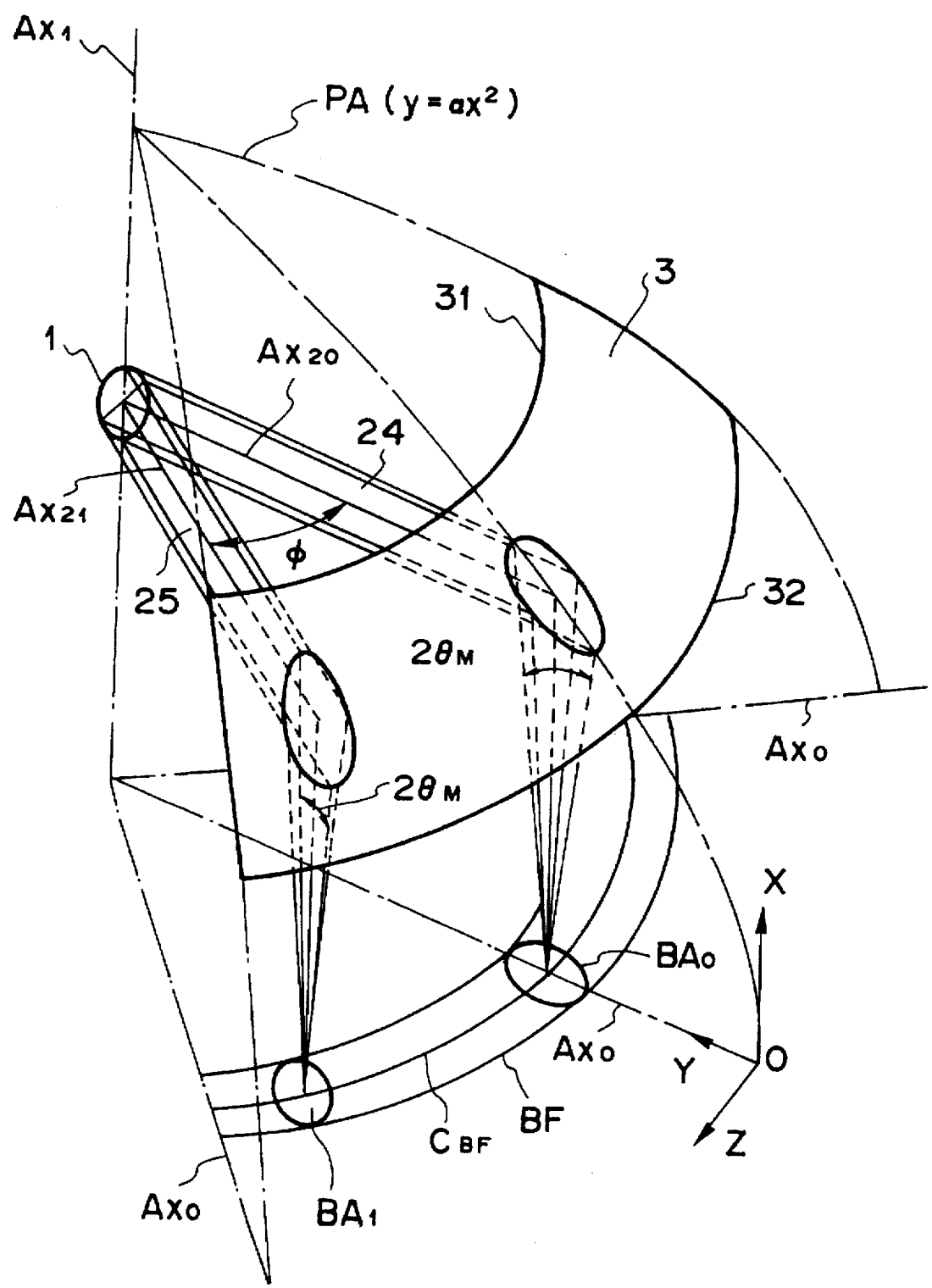
FIG. 22 shows an optical system (an example) of the illuminating apparatus according to the present invention (the tenth to sixteenth aspects) and is a perspective view of the light source image (or light source) 1, special reflecting mirror 3, and arcuate illuminated region BF.
Figure 23:
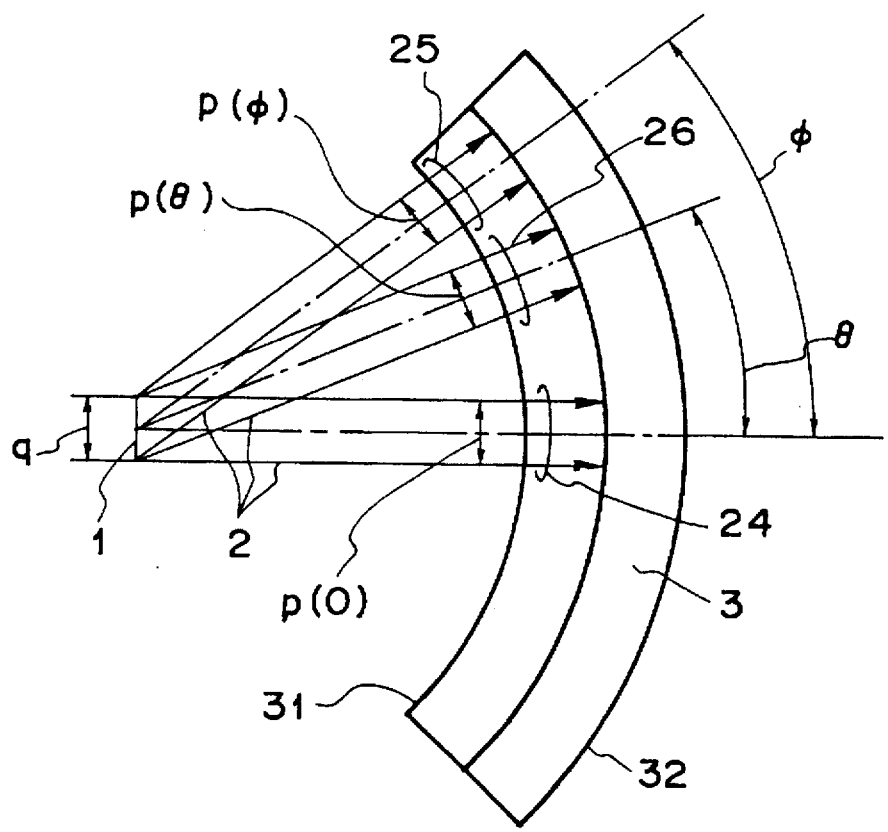
FIG. 23 shows an optical system (an example) of the conventional illuminating apparatus and is a cross section in the sagittal direction, of the light source image (or light source) 1 and reflecting mirror 3.
Figure 24A:
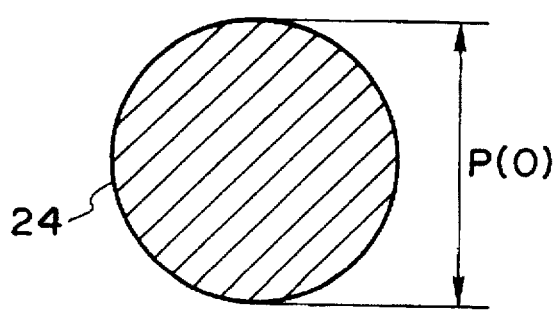
Figure 24B:
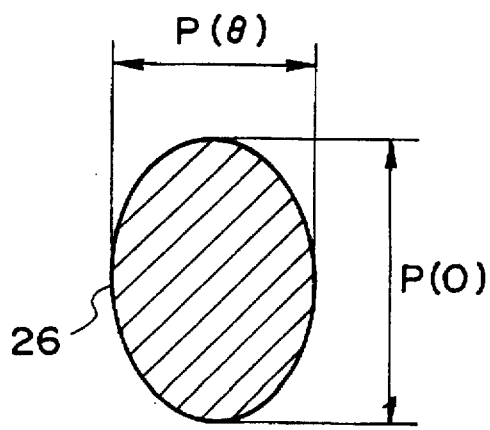
Figure 25:
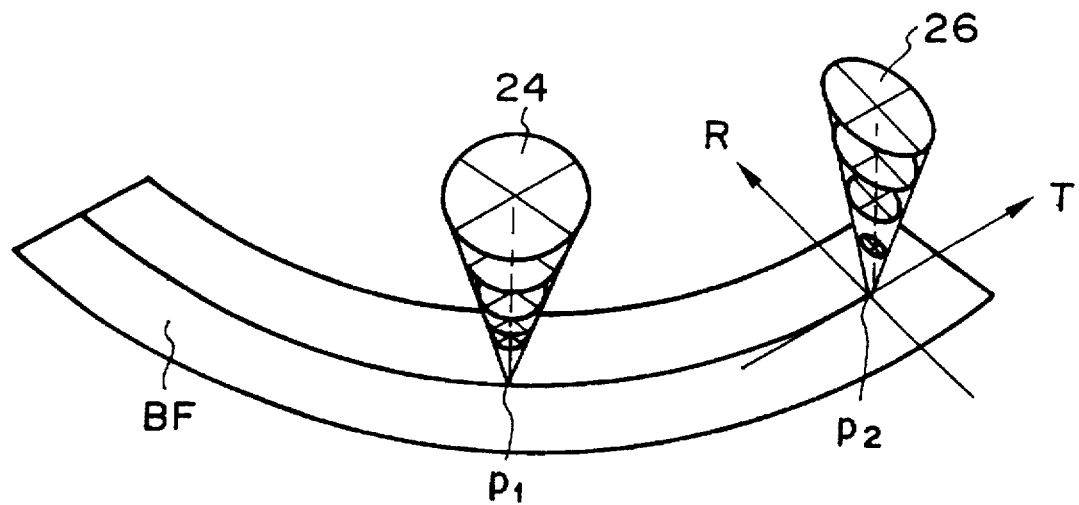
FIG. 25 is an explanatory drawing to show a state of beams converged on the illuminated surface in the conventional illuminating apparatus.
Figure 26:
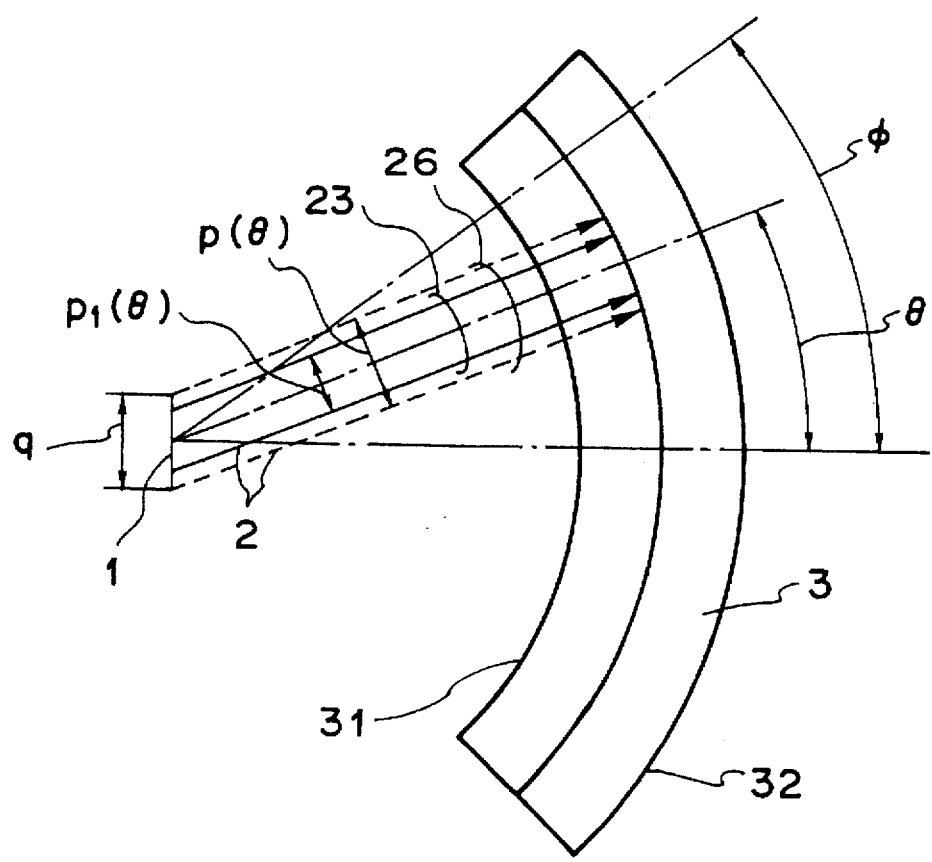
FIG. 26 shows an optical system (an example) of the conventional illuminating apparatus and is a cross section in the sagittal direction, of the light source image (or light source) 1 and reflecting mirror 3.

The reflectivity distribution $R_1(\theta)$ of this reflection type optical integrator is as shown in FIG. 21.

Beams from the light source image (or light source) formed by the reflection type optical integrators 4a, 4b were reflected and converged by the special reflecting mirror 3. By this, the illuminated surface (the surface of mask 9) was illuminated in an arcuate pattern under the Köhler illumination and in addition, the illuminated surface was illuminated with a uniform numerical aperture. Namely, the illuminated surface was illuminated in the arcuate pattern with uniform intensity while maintaining the telecentricity under the Köhler illumination.

The X-ray reflecting multilayer film (a lamination of a plurality of alternate layers of molybdenum and silicon) was formed on the surface of the special reflecting mirror 3, and the reflectivity distribution thereof $R_2(\theta)$ in the sagittal direction was a distribution as shown in FIG. 21. This reflectivity distribution was achieved by forming a distribution of period numbers of the multilayer film in the sagittal direction. Namely, a number of periods was decreased in a portion where X-rays at a larger exit angle were reflected. Specifically, the period numbers were changed between 11 and 20 periods.

FIG. 21 shows the distribution of $R_1(\theta) \cdot R_2(\theta)/\cos\theta$ in the present embodiment. The value of $R_1(\theta) \cdot R_2(\theta)/\cos\theta$ is constant independent of the value of $\theta$. Accordingly, the illuminating apparatus of the present embodiment can illuminate the illuminated surface (the surface of mask 9) with uniform intensity.

X-rays transmitted by the mask 9 were guided through the imaging apparatus 10 onto the substrate 11. On this occasion, the pattern on the mask 9 was transferred onto the substrate 11. In the present embodiment, the silicon wafer was used as the substrate, and a photoresist laid on the surface thereof was exposed to the X-rays. In this state, moving the mask 9 and substrate 11 in the directions of the arrows shown in FIG. 13, the pattern on the entire mask was transferred onto the substrate.

As a result, patterns with the minimum pattern size of 0.1 µm were able to be obtained throughout a large area (about 10 cm$^2$) on the substrate. Since the exposure apparatus provided with the conventional illuminating apparatus were not uniform in intensity of illumination light, a part of the resist was subjected to excessive exposure or insufficient exposure, which made it very difficult to obtain fine patterns over a large area as achieved above.

The fact that such fine patterns were obtained over a large area shows that the illuminating apparatus of the present invention has sufficient performance as the illuminating apparatus for exposure apparatus. Further, because of the capability of exposure in a large area, the throughput of exposure apparatus is also greatly improved.

The present embodiment used the transmission type mask as the mask, but the same effects were also achieved using the reflection type mask.

Although the reflecting curved surfaces constituting the reflection type optical integrator were the cylindrical mirrors in the present embodiment, they may be fly's eye mirrors. Further, the present embodiment was an example in which the two reflection type optical integrators were used, but the present invention is by no means limited to it. Namely, an illuminating apparatus that controls the intensity of illumination light by the reflectivity distribution of the reflection type optical integrator and/or the special reflecting mirror falls within the scope of the present invention.

What is claimed is:

1. An illuminating apparatus comprising:

a light source system for forming a light source image of a predetermined size, and a condensing optical system for condensing beams from said light source system to illuminate an object;

wherein said light source system has a light source portion for supplying parallel beams, and a reflection type optical integrator for forming a plurality of light source images from the parallel beams from said light source portion;

said reflection type optical integrator is provided with reflecting surfaces for effecting critical illumination in a meridional direction of said condensing optical system and reflecting surfaces for effecting Köhler illumination in a sagittal direction of said condensing optical system;

said condensing optical system has a reflecting mirror for converting the beams from said light source image into parallel beams to illuminate said object in an arcuate pattern; and said reflecting mirror is composed of a part of a parabolictoric body of rotation obtained by rotating a parabola about a base axis normal to a symmetry axis of the parabola and passing through a position that is a predetermined distance along said symmetry axis from a vertex of the parabola.

2. An illuminating apparatus comprising:

a light source system for forming a light source image of a predetermined size, and a condensing optical system for condensing beams from said light source system to illuminate an object;

wherein said light source system has a light source portion for supplying parallel beams, and a reflection type optical integrator for forming a plurality of light source images from the parallel beams from said light source portion;

said reflection type optical integrator is arranged in such a manner that a plurality of cylindrical reflecting surfaces are continuously and integrally formed only in one direction, so that there are reflecting surfaces for effecting critical illumination in a meridional direction of said condensing optical system and reflecting surfaces for effecting Köhler illumination in a sagittal direction of said condensing optical system;

said condensing optical system has a reflecting mirror for converting the beams from said light source image into parallel beams to illuminate said object in an arcuate pattern; and said reflecting mirror is composed of a part of a parabolic-toric body of rotation obtained by rotating a parabola about a base axis normal to a symmetry axis of the parabola and passing through a position that is a predetermined distance along said symmetry axis from a vertex of the parabola.

3. An illuminating apparatus comprising:

an X-ray illuminating apparatus for forming a light source image of a predetermined size, and a condensing optical system for condensing X-ray beam from said illuminating apparatus to illuminate an object;

wherein said X-ray illuminating apparatus has a light source portion for supplying parallel X-ray beams, and a reflecting type optical integrator for forming a plurality of light source images from the parallel X-ray beams from said light source portion;

said reflection type optical integrator is arranged in such a manner that a plurality of cylindrical reflecting surfaces are continuously and integrally formed only in one direction, so that there are reflecting surfaces for effecting critical illumination in a meridional direction of said condensing optical system and reflecting surfaces for effecting Köhler illumination in a sagittal direction of said condensing optical system;

said condensing optical system has a reflecting mirror for converting the X-ray beams from said light source image into parallel X-ray beams to illuminate said object in an arcuate pattern;

said reflecting g mirror is composed of a part of a parabolic-toric body of rotation obtained by rotating a parabola about a base axis normal to a symmetry axis of the parabola and passing through a position that is a predetermined distance along said symmentry axis from a vertex of the parabola; and an X-ray reflecting multilayer film is provided on the reflecting surfaces of said reflecting type optical integrator and a reflecting surface of said reflecting mirror.

4. An illuminating apparatus according to claim 3, wherein said X-ray reflecting multilayer film is formed from a lamination of a plurality of alternating layers of a combination selected from combinations of molybdenum/silicon, molybdenum/silicon compound, ruthenium/silicon, ruthenium/silicon compound, rhodium/silicon, and rhodium/silicon compound.

5. An illuminating apparatus comprising:

a light source system for forming a light source image of a predetermined size, and a condensing optical system for condensing beams from said light source system to illuminate an object;

wherein said light source system has a light source portion for supplying parallel beams, and an optical integrator provided with a reflecting region and a non-reflecting region, for forming a plurality of light source images from the parallel beams from said light source portion;

said condensing optical system has a reflecting mirror for converting the beams from said light source image into parallel beams to illuminate said object in an arcuate pattern; and said reflecting mirror is composed of a part of a parabolic-toric body of rotation obtained by rotating a parabola about a base axis normal to a symmetry axis of the parabola and passing through a position that is a predetermined distance along said symmetry axis from a vertex of the parabola.

6. An illuminating apparatus comprising:

an X-ray illuminating apparatus for forming a light source image of a predetermined size, and a condensing optical system for condensing X-ray beams from said X-ray illuminating apparatus to illuminate an object;

wherein said X-ray illuminating apparatus has a light source portion of supplying parallel X-ray beams, and an optical integrator provided with a reflecting region and a non-reflecting region, for forming a plurality of light source images form the parallel X-ray beams from said light source portion;

said condensing optical system has a reflecting mirror for converting the X-ray beams from said light source image into parallel X-ray beams to illuminate said object in an arcuate pattern;

said reflecting mirror is composed of a part of a parabolic-toric body of rotation obtained by rotating a parabola about a base axis normal to a symmetry axis of the parabola and passing through a position that is a predetermined distance along said symmetry axis from a vertex of the parabloa; and said reflecting region of the optical integrator is formed from an X-ray reflecting multilayer film.

7. An illuminating apparatus according to claim 6, wherein said X-ray reflecting multilayer film is formed from a lamination of a plurality of alternating layers of a combination selected from combinations of molybdenum/silicon, molybdenum/silicon compound, ruthenium/silicon, ruthenium/silicon compound, rhodium/silicon, and rhodium/silicon compound.

8. An illuminating apparatus according to claim 6, wherein said non-reflecting region of the optical integrator is formed from an X-ray absorbing film.

9. An illuminating apparatus according to claim 8, wherein said X-ray absorbing film is formed mainly of nickel, silver, cadmium, cobalt, copper, iron, indium, platinum, antimony, tin, tellurium, or zinc.

10. An illuminating apparatus comprising:

an X-ray illuminating apparatus for forming a light source image of a predetermined size, and a condensing optical system for condensing X-ray beams from said X-ray illuminating apparatus to illuminate an object;

wherein said X-ray illuminating apparatus has a light source portion for supplying parallel X-ray beams, and a reflection type optical integrator for forming a plurality of light source images from the parallel X-ray beams from said light source portion:

said condensing optical system has a reflecting mirror for converting the X-ray beams from said light source image into parallel X-ray beams to illuminate said object in an arcuate pattern;

said reflecting mirror is composed of a part of a parabolic-toric body of rotation obtained by rotating a parabola about a base axis normal to a symmetry axis of the parabola and passing through a position that is a predetermined distance along said symmetry axis from a vertex of the parabola; and a reflecting surface of at least one of said optical integrator and said reflecting mirror is provided with an X-ray reflectivity distribution such that the parallel X-ray beams illuminating said object have substantially equal intensity.

11. An illuminating apparatus according to claim 10, wherein said X-ray reflectivity distribution is provided so as to keep a value of $R_1(\theta) \cdot R_2(\theta)/\cos\theta$ approximately constant, where $\theta$ is an exit angle of X-rays outgoing from a reflecting surface of said optical integrator, $R_1(\theta)$ is a reflectivity on said reflecting surface of said optical integrator, and $R_2(\theta)$ is a reflectivity when the X-rays outgoing at the exit angle $\theta$ from said reflecting surface of said optical integrator are reflected by said reflecting mirror.

12. An illuminating apparatus according to claim 11, wherein said X-ray reflectivity distribution is provided by forming an X-ray reflecting multilayer film having an in-plane distribution of period lengths in the reflecting surface of at least one of said optical integrator and said reflecting mirror.

13. An illuminating apparatus according to claim 11, wherein said X-ray reflectivity distribution is provided by forming an X-ray reflecting multilayer film having an in-plane distribution of period numbers in the reflecting surface of at least one of said optical integrator and said reflecting mirror.

14. An illuminating apparatus according to claim 11, wherein said X-ray reflectivity distribution is provided by forming an X-ray reflecting multilayer film and an X-ray absorbing film thereon having a film thickness distribution in the reflecting surface of at least one of said optical integrator and said reflecting mirror.

15. An illuminating apparatus according to claim 14, wherein said X-ray reflecting multilayer film is formed from a lamination of a plurality of alternating layers of a combination selected from combinations of molybdenum/silicon, molybdenum/silicon compound, ruthenium/silicon, ruthenium/silicon compound, rhodium/silicon, and rhodium/silicon compound.

16. An illuminating apparatus according to claim 14, wherein said X-ray absorbing film is formed mainly of silicon, beryllium, zirconium, boron, carbon, or molybdenum.

* * * * *